US011849551B2

(12) United States Patent
Choi et al.

(10) Patent No.: US 11,849,551 B2
(45) Date of Patent: Dec. 19, 2023

(54) ROLLABLE DISPLAY DEVICE AND A METHOD OF MANUFACTURING THE SAME

(71) Applicant: Samsung Display Co., Ltd., Yongin-Si (KR)

(72) Inventors: Jin Hwan Choi, Seoul (KR); Beomjin Kim, Asan-si (KR); Jonghwa Lee, Hwaseong-si (KR); Dongwon Choi, Seoul (KR); Taewoong Kim, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/536,266

(22) Filed: Nov. 29, 2021

(65) Prior Publication Data

US 2022/0240402 A1 Jul. 28, 2022

(30) Foreign Application Priority Data

Jan. 26, 2021 (KR) ........................ 10-2021-0010888

(51) Int. Cl.
H05K 5/02 (2006.01)
H05K 5/03 (2006.01)
G06F 1/16 (2006.01)

(52) U.S. Cl.
CPC ......... H05K 5/0226 (2013.01); G06F 1/1652 (2013.01); G06F 1/1681 (2013.01); H05K 5/03 (2013.01)

(58) Field of Classification Search
CPC .... G06F 1/1652; G06F 1/1681; H05K 5/0226
See application file for complete search history.

(56) References Cited

U.S. PATENT DOCUMENTS 9,730,318 B2   8/2017   Choi et al.
9,772,657 B2*  9/2017   Takayanagi ......... H04M 1/0268
(Continued)

FOREIGN PATENT DOCUMENTS

KR  10-2016-0005845   1/2016
KR  10-2016-0047651   5/2016
(Continued)

OTHER PUBLICATIONS

Examination report dated Apr. 25, 2022 from the WO Patent Office issued in corresponding application No. PCT/KR2022/000608.

*Primary Examiner* — Rockshana D Chowdhury
*Assistant Examiner* — Douglas R Burtner
(74) *Attorney, Agent, or Firm* — F. Chau & Associates, LLC

(57) ABSTRACT

A rollable display device including: a support module; a display module disposed on the support module and including a display area and a non-display area adjacent to the display area; and a resin layer disposed between the support module and the display module, the display module including a display panel including a plurality of pixels, the support module including: a plurality of support bars extending in a first direction and arranged in a second direction crossing the first direction, wherein the support bars are spaced apart from each other; and a plurality of hinges disposed between the support bars and coupled with the support bars disposed adjacent thereto, and wherein each of the support bars is rotatably coupled with the hinges with respect to a driving axis extending in the first direction and the driving axis penetrates the display panel when viewed in a cross-section.

19 Claims, 31 Drawing Sheets

(56) References Cited

U.S. PATENT DOCUMENTS

| | | | |
|---|---|---|---|
| 9,940,892 B2 | 4/2018 | Pang | |
| 10,074,824 B2* | 9/2018 | Han | G06F 1/1677 |
| 10,274,995 B2* | 4/2019 | Seo | G06F 1/1656 |
| 10,289,164 B2* | 5/2019 | Seo | F16M 11/38 |
| 10,963,014 B1* | 3/2021 | Park | H04B 1/3827 |
| 11,042,195 B1* | 6/2021 | Hong | G06F 1/1652 |
| 11,212,379 B2* | 12/2021 | Baek | G06F 1/1681 |
| 11,231,754 B2* | 1/2022 | Kang | E05D 3/122 |
| 11,245,781 B2* | 2/2022 | Song | H04M 1/0268 |
| 11,252,826 B2* | 2/2022 | Park | H04M 1/0235 |
| 11,329,247 B2* | 5/2022 | Baek | G06F 3/046 |
| 11,481,000 B2* | 10/2022 | Kim | G06F 1/1652 |
| 11,497,130 B2* | 11/2022 | Song | G06F 1/1624 |
| 11,579,658 B2* | 2/2023 | Kim | G09F 9/301 |
| 2006/0007368 A1* | 1/2006 | Slikkerveer | G09F 9/301 |
| | | | 349/58 |
| 2011/0227822 A1* | 9/2011 | Shai | G06F 1/169 |
| | | | 345/156 |
| 2016/0231843 A1* | 8/2016 | Kim | G06F 3/041 |
| 2016/0363960 A1* | 12/2016 | Park | G09F 15/0062 |
| 2016/0374228 A1* | 12/2016 | Park | G09F 9/301 |
| 2017/0359910 A1* | 12/2017 | Seo | H05K 5/0217 |
| 2018/0150112 A1* | 5/2018 | Aoki | G06F 1/1652 |
| 2019/0208650 A1 | 7/2019 | Kim et al. | |
| 2021/0405703 A1* | 12/2021 | Song | G06F 1/1694 |
| 2022/0019260 A1* | 1/2022 | Kang | G06F 1/1698 |
| 2022/0019261 A1* | 1/2022 | Kang | G06F 1/1652 |
| 2022/0091636 A1* | 3/2022 | Cho | G06F 1/1677 |
| 2022/0113764 A1* | 4/2022 | Kwak | H04M 1/0237 |
| 2022/0113765 A1* | 4/2022 | Kang | H05K 5/0226 |
| 2022/0166861 A1* | 5/2022 | Lim | G06F 1/1681 |
| 2022/0174829 A1* | 6/2022 | Choi | H05K 5/0017 |
| 2022/0182477 A1* | 6/2022 | Kim | H04M 1/0268 |
| 2022/0183173 A1* | 6/2022 | Kim | H05K 5/0017 |
| 2022/0201108 A1* | 6/2022 | Kim | H04M 1/72409 |
| 2022/0201880 A1* | 6/2022 | Choi | H04M 1/0235 |
| 2022/0311846 A1* | 9/2022 | Kwak | H04M 1/0235 |
| 2022/0346256 A1* | 10/2022 | Kim | H05K 5/0226 |
| 2023/0007796 A1* | 1/2023 | Ahn | H04M 1/0268 |

FOREIGN PATENT DOCUMENTS

| | | | |
|---|---|---|---|
| KR | 10-2016-0129669 | 11/2016 | |
| KR | 10-2018-0025358 | 3/2018 | |
| KR | 10-2018-0036904 | 4/2018 | |
| KR | 10-2020-0077656 | 7/2020 | |
| WO | WO-2014087951 A1 * | 6/2014 | G06F 1/1643 |

* cited by examiner

FIG. 9A
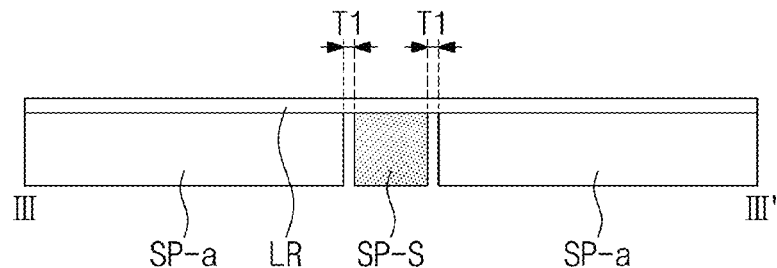
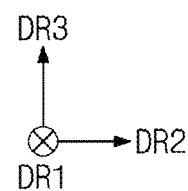
FIG. 9B
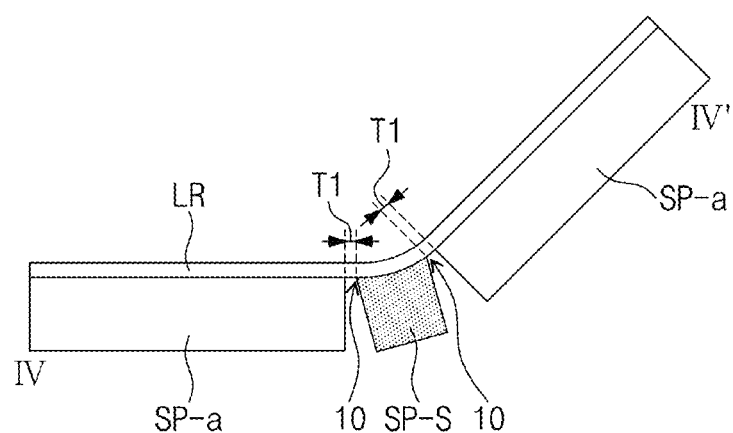
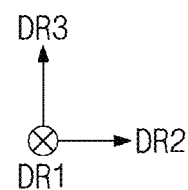

FIG. 10A
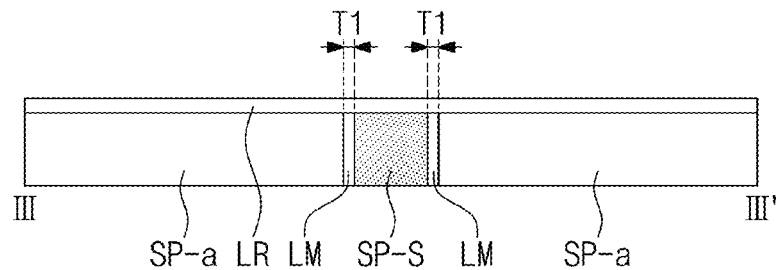
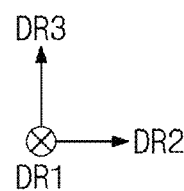
FIG. 10B
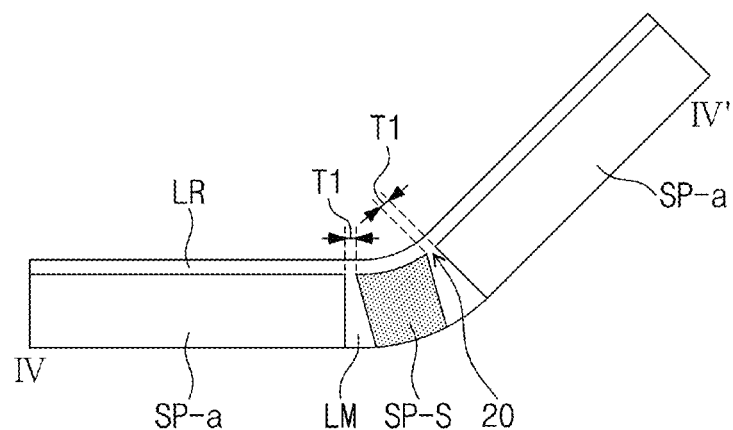
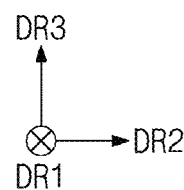

FIG. 18A
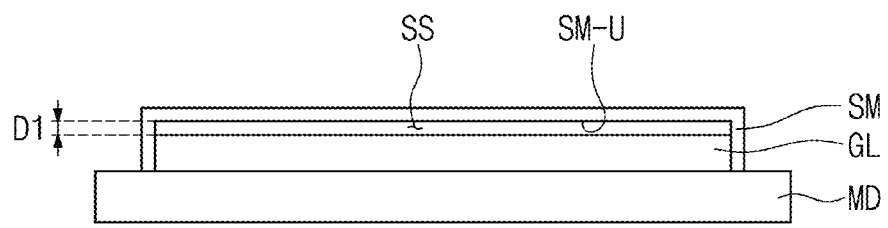
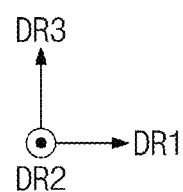
FIG. 18B
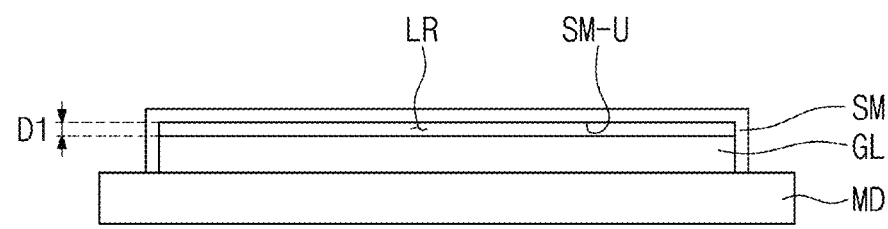
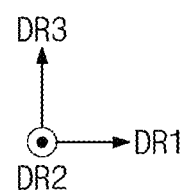

FIG. 20A
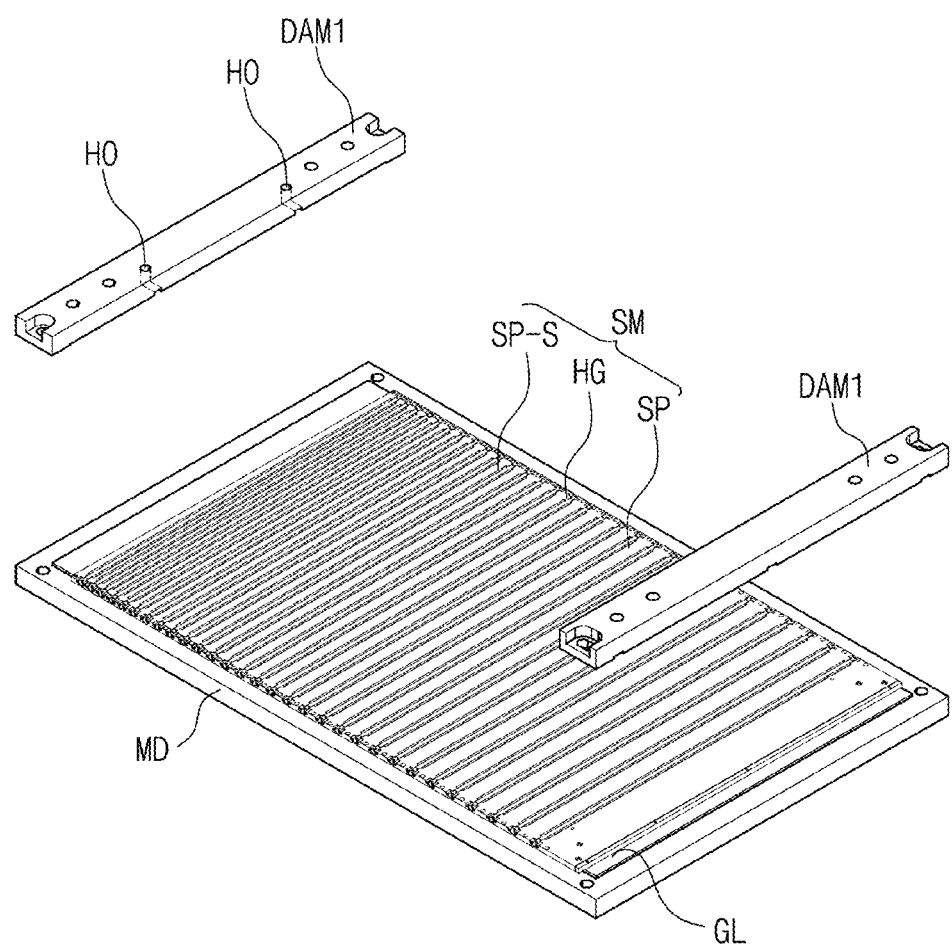
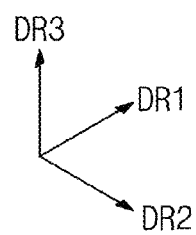

ROLLABLE DISPLAY DEVICE AND A METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2021-0010888, filed on Jan. 26, 2021, the disclosure of which is incorporated by reference herein in its entirety.

1. Technical Field

The present disclosure relates to a display device. More particularly, the present disclosure relates to a rollable display device and a method of manufacturing the rollable display device.

2. Description of the Related Art

A display device is an output device for presentation of information in visual form. Multimedia devices, such as a television, a mobile phone, a tablet computer, a notebook computer, and a game unit, include a display device to provide images to a user. As technology advances, various types of display devices are being developed. For example, various flexible display devices, which are capable of being curved, folded or rolled, have been developed. The flexible display devices can be easy to carry and convenient.

For example, a rollable display device, which can be rolled up like a newspaper, has superior portability than a non-rollable display device.

A display module of a rollable display device has a structure in which various components are stacked. However, stress generated when the rollable display device is rolled may damage the components of the display module. In addition, a surface quality of the display module may deteriorate depending on a support structure supporting the rollable display device.

SUMMARY

The present disclosure provides a rollable display device capable of increasing a surface quality and a reliability of a display module.

The present disclosure provides a method of manufacturing the rollable display device with increased reliability.

An embodiment of the present disclosure provides a rollable display device including: a support module; a display module disposed on the support module and including a display area and a non-display area adjacent to the display area; and a resin layer disposed between the support module and the display module, the display module including a display panel including a plurality of pixels, the support module including: a plurality of support bars extending in a first direction and arranged in a second direction crossing the first direction, wherein the support bars are spaced apart from each other; and a plurality of hinges disposed between the support bars and coupled with the support bars disposed adjacent thereto, and wherein each of the support bars is rotatably coupled with the hinges with respect to a driving axis extending in the first direction and the driving axis penetrates the display panel when viewed in a cross-section.

A neutral plane of the display module may be defined in the display panel at a same position as the driving axis when viewed in the cross-section.

The resin layer may have a modulus equal to or greater than about 1 kPa and equal to or less than about 50 MPa.

Each of the support bars may include a coupling portion, the coupling portion may be inserted into a coupling recess in each of the hinges, and the coupling portion of each of the support bars may move within the coupling recess.

The support module may further include a sub-support bar extending in the first direction and disposed between a pair of the support bars, and the sub-support bar may be coupled to the hinges connected to the pair of the support bars.

Each of the support bars may have a width in the second direction and the widths of the support bars may be different from each other.

A difference in width between the support bars adjacent to each other may be constant.

The support module may include a rolling area and a peripheral area adjacent to the rolling area, the support module may be in a flat state or in a rolled state depending on whether the support module is rolled with respect to a rolling axis spaced apart from the driving axis, a length of the rolling area of the support module defined in the second direction in the flat state may satisfy the following Equation 1 of $$L = x \cdot a + \frac{x \cdot b(x-1)}{2},$$

an outer diameter of the support module in the rolled state may satisfy the following Equation 2 of $D = (\sqrt{2}+1) \cdot \{a+(5+x)b\}$, L may denote the length of the rolling area of the support module, D may denote the outer diameter of the support module, x may denote a number of the support bars, a may denote a smallest width among the widths of the support bars, and b may denote a difference in width between the support bars adjacent to each other.

The support module may further include a plurality of bonding portions filled in a separation space between the support bars.

The bonding portions may be provided integrally with the resin layer.

The support bars may include surfaces that are in contact with the bonding portions, and at least a portion of the surfaces may include a curved surface.

The support module may further include a plurality of magnets inserted into at least one of the support bars.

The magnets may be spaced apart from the display area in a plane view.

The display module may further include: a window disposed on the display panel; and a protective layer disposed between the display panel and the resin layer, wherein a neutral plane may be defined between a lower surface of the display panel and an upper surface of the display panel.

The rollable display device may further include: a flexible circuit board electrically connected to the display panel; and a main circuit board disposed on a lower surface of the support module, the support bars including: first support bars overlapping the display area and connected to each other; and a second support bar connected to one first support bar disposed at an outermost position in the second direction among the first support bars, and wherein the main circuit board is spaced apart from the first support bars in a plane view and overlaps the second support bar, and the flexible circuit board surrounds at least a portion of the second support bar and is electrically connected to the main circuit board.

Widths of the first support bars, which are defined in the second direction, may increase as a distance from the second support bar decreases.

The rollable display device may further include a case spaced apart from the display area and accommodating the flexible circuit board and the main circuit board.

An embodiment of the present disclosure provides a method of manufacturing a rollable display device, the method including: disposing a plate on a mold; disposing a support module on the mold, wherein a space is provided between the support module and the plate; filling a resin in the space; curing the resin to form a resin layer; separating the plate from the resin layer; and disposing a display module on the resin layer from which the plate is separated.

The method may further include coating a primer on the support module before the disposing of the support module.

The method may further include disposing a spacer supporting the support module on the plate after the disposing of the plate.

An embodiment of the present disclosure provides a rollable display device including: a support module comprising a plurality of support bars and a plurality of hinges; a display module disposed on the support module; and a resin layer disposed between the display module and the support module, wherein the plurality of support bars extended in a first direction and arranged in a second direction crossing the first direction, and the plurality of hinges connecting adjacent support bars to each other, and wherein widths of the support bars are different from each other.

Widths of the support bars may increase from a first side of the display module to a second side of the display module.

The support module may further include a plurality of sub-support bars connected to the hinges.

The resin layer may overlap a gap between adjacent support bars.

According to the above, the rollable display device includes the support module that provides the flat upper surface, and thus, the surface quality of the rollable display device is improved.

In addition, as the driving axis of the support module is defined to penetrate through the display panel when viewed in cross-section, the reliability of the display module is increased.

BRIEF DESCRIPTION OF THE DRAWINGS

The above and other features of the present disclosure will become readily apparent by reference to the following detailed description when considered in conjunction with the accompanying drawings wherein:

FIG. 9A is a cross-sectional view taken along a line III-III' shown in FIG. 8A to show some components of a rollable display device according to an embodiment of the present disclosure;

FIG. 9B is a cross-sectional view taken along a line IV-IV' shown in FIG. 8B to show some components of a rollable display device according to an embodiment of the present disclosure;

FIG. 10A is a cross-sectional view taken along a line III-III' shown in FIG. 8A to show some components of a rollable display device according to an embodiment of the present disclosure;

FIG. 10B is a cross-sectional view taken along a line IV-IV' shown in FIG. 8B to show some components of a rollable display device according to an embodiment of the present disclosure;

FIGS. 18A, 18B, 18C and 18D are cross-sectional views showing a method of manufacturing a rollable display device according to an embodiment of the present disclosure;

FIGS. 20A, 20B, and 20C are perspective views showing a method of manufacturing a rollable display device according to an embodiment of the present disclosure.

DETAILED DESCRIPTION OF THE EMBODIMENTS

Figure 1A:
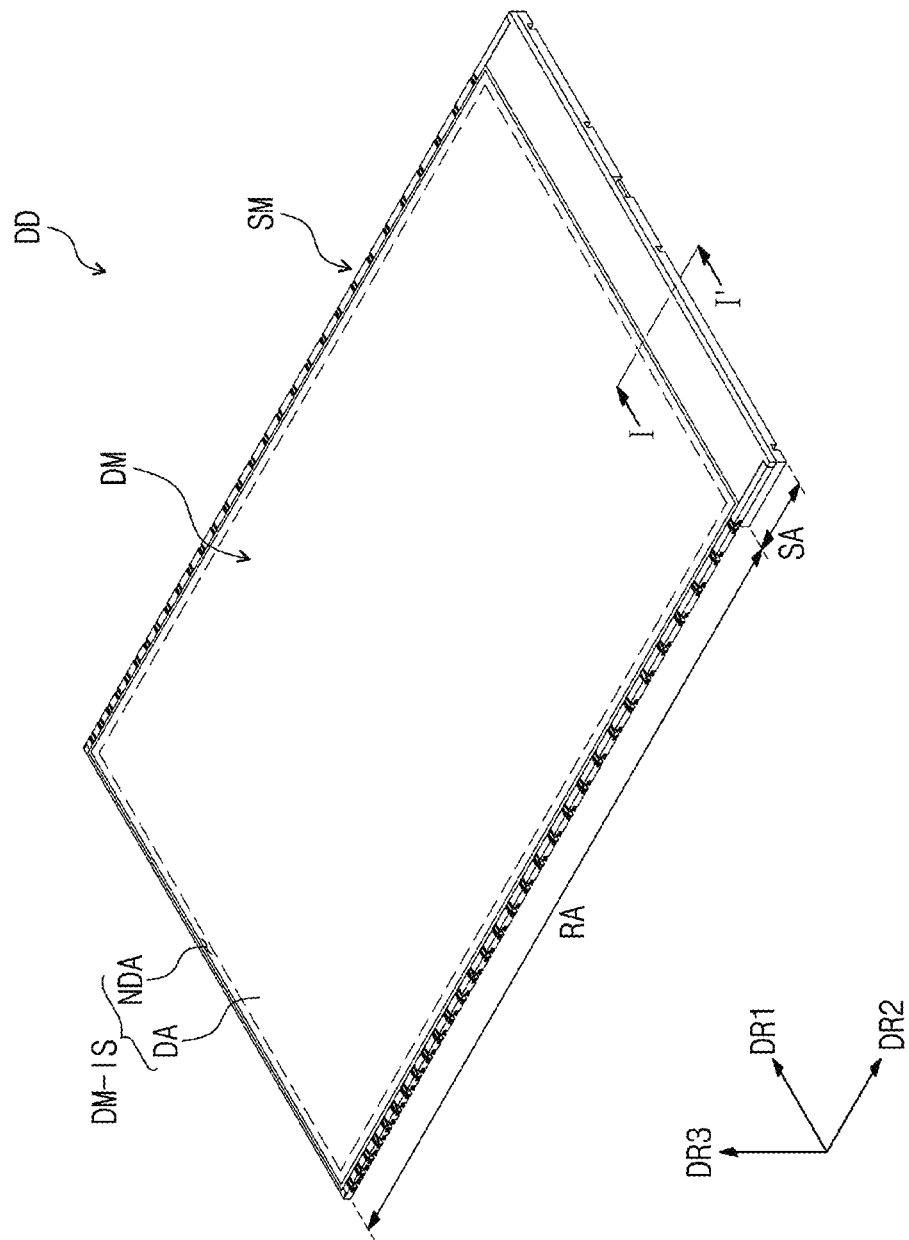
FIG. 1A is a perspective view showing a rollable display device in a flat state according to an embodiment of the present disclosure.

The present disclosure may be variously modified and realized in many different forms, and thus specific embodiments will be illustrated in the drawings and described in detail hereinbelow. However, the present disclosure should not be limited to the specific disclosed forms, and be construed to include all modifications, equivalents, or replacements included in the spirit and scope of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout. In the drawings, the thickness, ratio, and dimension of components may be exaggerated for effective description of the technical content.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, a rollable display device and a method of manufacturing the rollable display device of the present disclosure will be explained in detail with reference to the accompanying drawings.

Figure 1B:
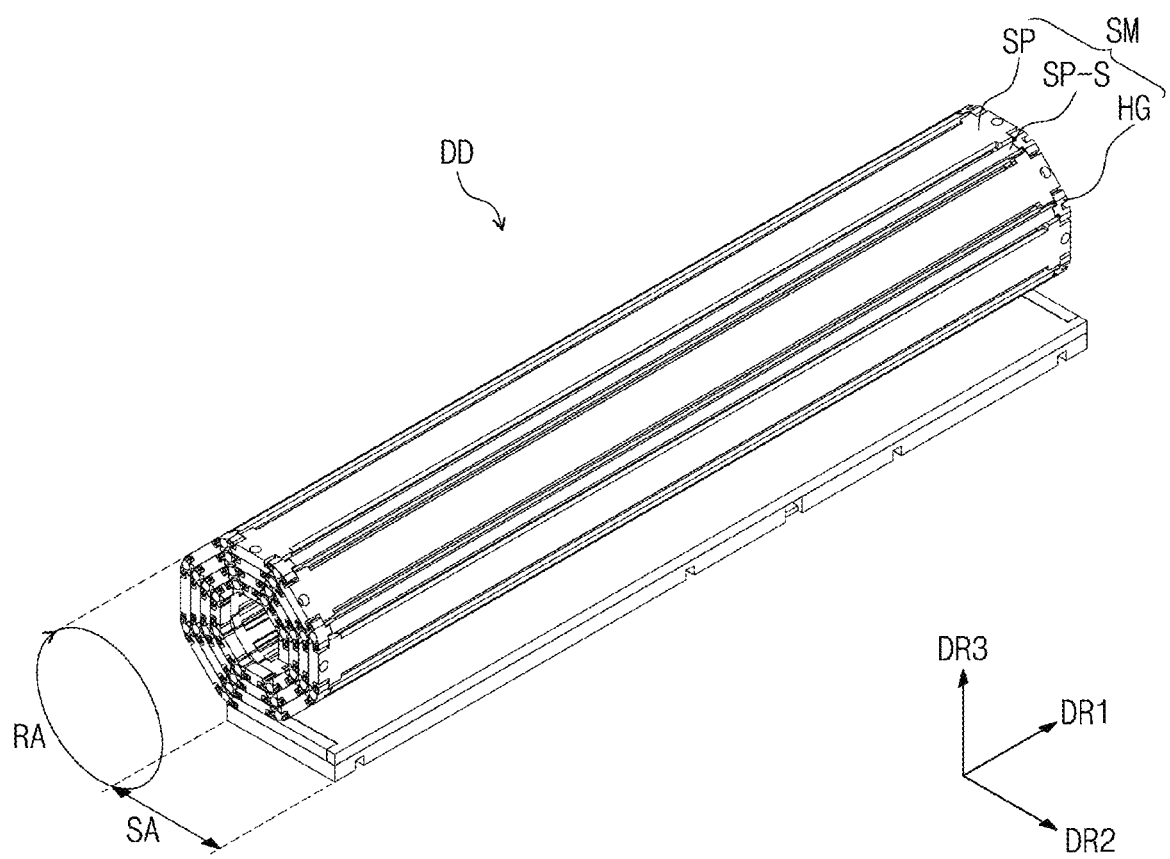
FIG. 1B is a perspective view showing the rollable display device in a rolled state according to an embodiment of the present disclosure.

FIGS. 1A and 1B are perspective views showing a rollable display device DD according to an embodiment of the present disclosure. FIG. 1A is a perspective view showing a rollable display device DD in a flat state in which the rollable display device DD is not rolled according to an embodiment of the present disclosure. FIG. 1B is a perspective view showing the rollable display device DD in a rolled state in which the rollable display device DD is rolled in a clockwise direction according to an embodiment of the present disclosure.

An upper surface of the rollable display device DD may be substantially parallel to a plane formed by a first direction DR1 and a second direction DR2 crossing the first direction DR1. The rollable display device DD may have a thickness in a third direction DR3 perpendicular to the plane formed by the first direction DR1 and the second direction DR2. The rollable display device DD may have a hexahedron shape when the rollable display device DD is in the flat state, however, the shape of the rollable display device DD should not be limited to the hexahedron shape.

Upper (or front) and lower (or rear) surfaces of each member may be described with respect to a surface substantially parallel to the first direction DR1 and the second direction DR2. The front and rear surfaces are opposite to each other in the third direction DR3, and a normal line direction of each of the front and rear surfaces may be substantially parallel to the third direction DR3.

In the following descriptions, the expression "in a plane view" may mean a state of being viewed from the above of components, e.g., a state of being viewed in the third direction DR3. In the following descriptions, the expression "in a cross-section" or "in a side view" may mean a state of being viewed in the first direction DR1 or the second direction DR2. In the following descriptions, a "thickness direction" may be a direction substantially parallel to the third direction DR3.

A separation distance between the front and rear surfaces of each member in the third direction DR3 may correspond to a thickness or a height of each member. Directions indicated by the first, second, and third directions DR1, DR2, and DR3 may be relative to each other and may be changed to other directions.

Referring to FIG. 1A, the rollable display device DD may include a display module DM, a support module SM, and a resin layer LR (refer to FIG. 28). The rollable display device DD may be rolled with respect to an imaginary rolling axis. For example, the rollable display device DD may be rolled in a clockwise or counterclockwise direction along a rolling axis. The display module DM may be flexible.

The display module DM may provide an image to a user through a display surface DM-IS. The display surface DM-IS may be substantially parallel to the surface formed by the first direction DR1 and the second direction DR2. The display surface DM-IS may include a display area DA and a non-display area NDA. The display area DA may be an area in which the image is displayed, and the non-display area NDA may be an area in which the image is not displayed. The non-display area NDA may surround the display area DA, however, it should not be limited thereto or thereby. The non-display area NDA may be adjacent to only one side of the display area DA.

The display module DM may include a plurality of pixels generating the image displayed through the display area DA. Each of the pixels may include a light emitting element and a transistor electrically connected to the light emitting element. The pixels may include an organic light emitting diode as an example of the light emitting element. The pixels may be disposed in the display area DA, however, they should not be limited thereto or thereby. According to an embodiment of the present disclosure, some of the pixels may be disposed in the non-display area NDA.

The support module SM may be disposed under the display module DM. The support module SM may support a lower surface and a side surface of the display module DM. The support module SM may support the display module DM and substantially simultaneously may roll the display module DM with a predetermined curvature.

The support module SM may include a rolling area RA and a peripheral area SA. The rolling area RA may be rolled with respect to the imaginary rolling axis. The peripheral area SA may be adjacent to one side of the rolling area RA, and a circuit board that applies electrical signals to the display module DM may be disposed in the peripheral area SA. For example, the peripheral area SA may be adjacent to a short side of the rolling area RA; however, the present disclosure is not limited thereto and the peripheral area SA may be adjacent to a long side of the rolling area RA.

The resin layer LR (refer to FIG. 2B) may be disposed between the support module SM and the display module DM. The resin layer LR may combine the display module DM with the support module SM. The resin layer LR may provide a flat upper surface, and thus, may increase a surface quality of the display module DM when the display module DM is rolled. This will be described in detail later.

Referring to FIG. 1B, the support module SM may include a plurality of support bars SP and a plurality of hinges HG. The support module SM may further include a plurality of sub-support bars SP-S. Hereinafter, the rollable display device DD that includes the sub-support bars SP-S will be described as an example, however, the present disclosure should not be limited thereto or thereby. According to an embodiment of the present disclosure, the sub-support bars SP-S may be omitted.

The support bars SP may extend in a direction substantially parallel to the imaginary rolling axis. The support bars SP may extend in the first direction DR1 and may be arranged in the second direction DR2. The support bars SP may include long sides extending in the first direction DR1 and short sides extending in the second direction DR2. The long sides of the support bars SP may be parallel to the short side of the rolling area RA, and the short sides of the support bars SP may be parallel to the long side of the rolling area RA, however, the present disclosure is not limited thereto.

Each of the support bars SP may include a metal material. However, the material for the support bars SP should not be particularly limited as long as the support bars SP may support the display module DM.

Each of the hinges HG may be disposed between the support bars SP adjacent to each other and may combine the adjacent support bars SP to each other. In other words, a hinge HG may be disposed between a pair of the support bars SP. Each of the hinges HG may be disposed adjacent to the short sides of the support bars SP in the second direction DR2 and may be coupled with the support bars SP adjacent thereto.

The hinges HG may be spaced apart from each other with the support bar SP interposed therebetween and coupled therewith in the second direction DR2. The hinges HG respectively coupled with one side and the other side of one support bar SP may be spaced apart from each other in the first direction DR1. In other words, a first hinge HG connecting two adjacent support bars SP to each other may be disposed on a first side of the rolling area RA, and a second hinge HG connecting the two adjacent support bars SP to each other may be disposed on a second side of the rolling area RA opposite the first side.

Each of the support bars SP may be coupled with the hinges HG to rotate with respect to a driving axis extending in the first direction DR1. The support bars SP may be rotated at a predetermined angle with respect to the driving axis. In the following descriptions, the driving axis may be an imaginary fixed rotation axis that serves as a center of rotation when the support bar is rotated at a predetermined angle. The support module SM may be rolled with a predetermined radius of curvature with respect to the rolling axis spaced apart from the driving axis by the support bars SP rotatably coupled with the hinges HG. The radius of the curvature of the rolled support module SM may be changed depending on structures of the support bars SP and the hinges HG.

Each of the sub-support bars SP-S may extend in the same direction as the direction in which the support bars SP extend. The sub-support bars SP-S may include long sides extending in the first direction DR1 and short sides extending in the second direction DR2.

Each of the sub-support bars SP-S may be disposed between the support bars SP adjacent to each other. The sub-support bars SP-S may be disposed adjacent to the long sides of the support bars SP. The sub-support bars SP-S and the support bars SP may be alternately arranged with each other in the second direction DR2.

Each of the sub-support bars SP-S may be coupled with the hinges HG spaced apart from each other in the first direction DR1. The support bars SP may move after being coupled with the hinges HG, and the sub-support bars SP-S may be fastened after being coupled with the hinges HG. In other words, the sub-support bars SP-S may be fixed in place by the hinges HG.

The sub-support bars SP-S may be disposed between the support bars SP spaced apart from each other and may support the display module DM. The sub-support bars SP-S may be disposed between the support bars SP spaced apart from each other and may increase the surface quality of the display module DM when the display module DM is rolled.

Figure 2A:
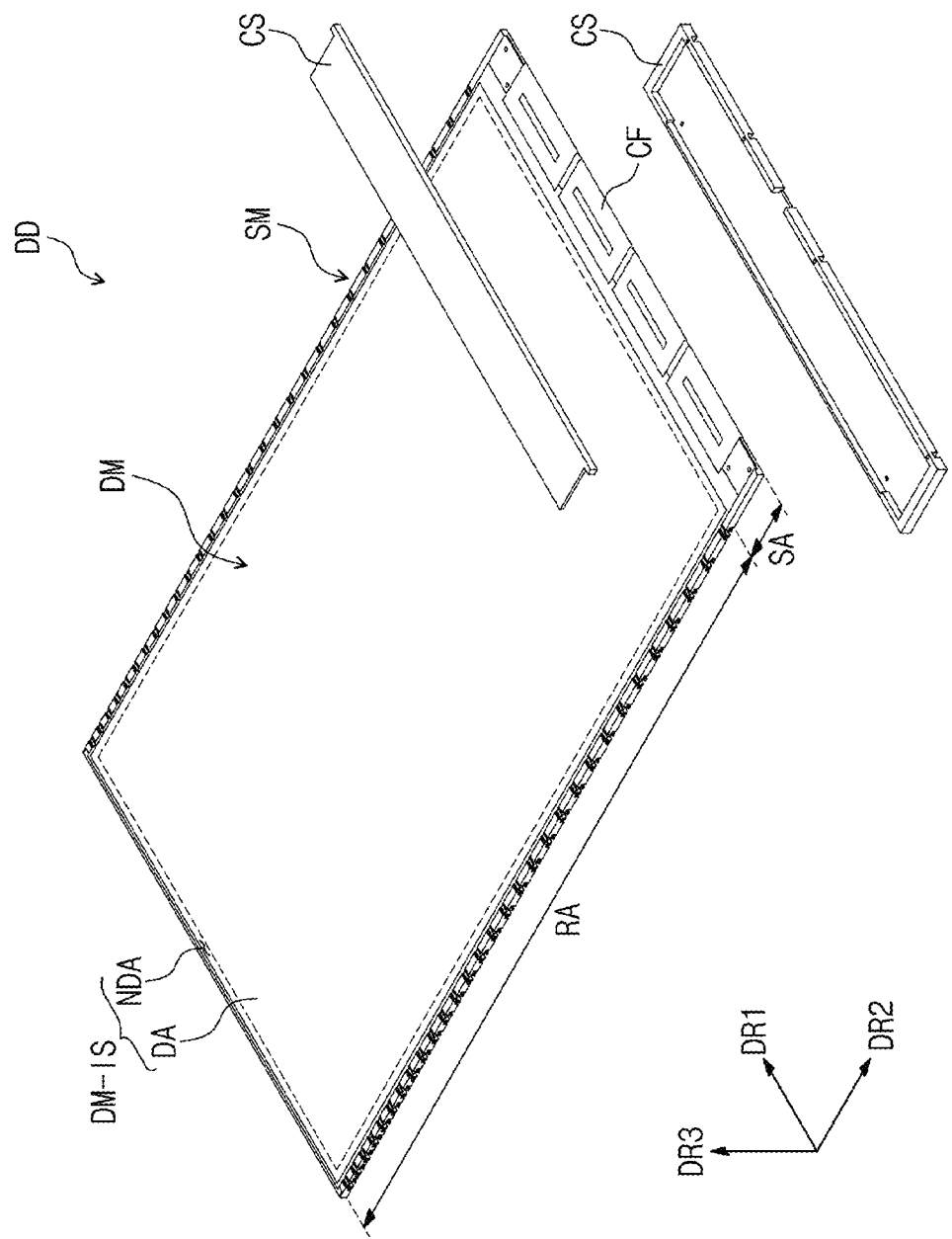
FIG. 2A is an exploded perspective view showing some components of the rollable display device shown in FIG. 1A.
Figure 2B:
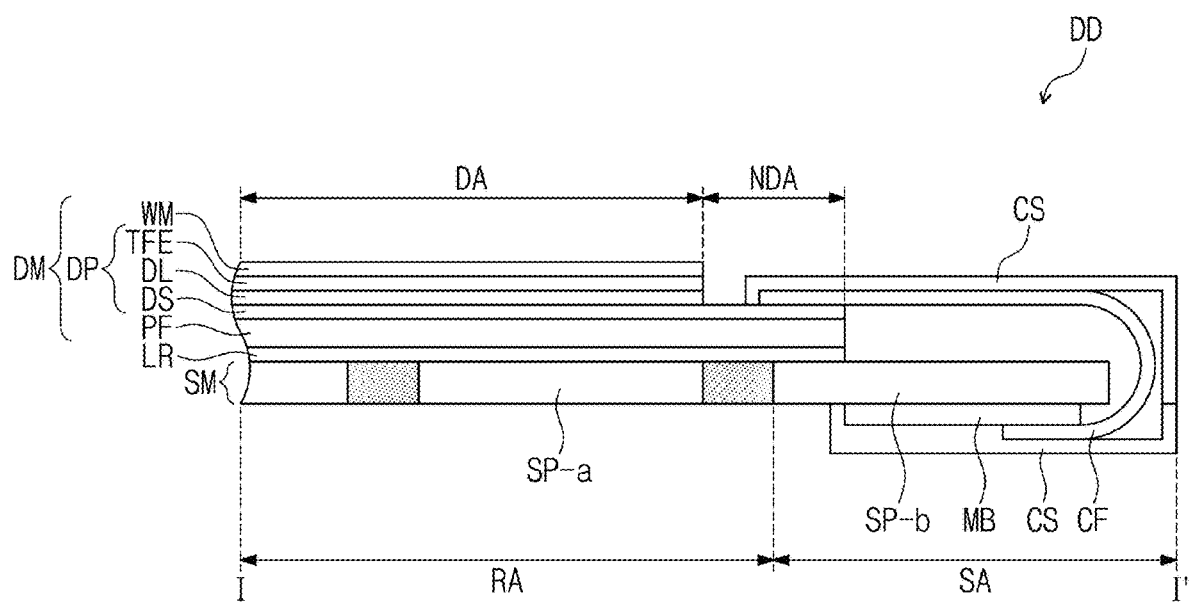
FIG. 2B is a cross-sectional view taken along a line I-I' shown in FIG. 1A.

FIG. 2A is an exploded perspective view showing some components of the rollable display device DD shown in FIG. 1A, and FIG. 2B is a cross-sectional view taken along a line I-I' shown in FIG. 1A.

Referring to FIGS. 2A and 2B, the rollable display device DD may further include a flexible circuit board CF, a main circuit board MB, and a case CS. The flexible circuit board CF and the main circuit board MB may apply electrical signals to a display panel DP included in the display module DM.

The flexible circuit board CF may be disposed on the support module SM. The flexible circuit board CF may overlap the peripheral area SA of the support module SM.

The flexible circuit board CF may be electrically connected to the display panel DP and the main circuit board MB. One end of the flexible circuit board CF may be electrically connected to an area of the display panel DP overlapping the non-display area NDA. The other end of the flexible circuit board CF may be electrically connected to the main circuit board MB.

A driving circuit may be mounted on the flexible circuit board CF. The flexible circuit board CF may transmit a signal from the main circuit board MB to the driving circuit and may transmit a signal from the driving circuit to the display panel DP. However, according to an embodiment of the present disclosure, the driving circuit may be mounted on the display panel DP or the main circuit board MB.

The flexible circuit board CF may include a base layer that is flexible. The flexible circuit board CF may have flexibility, may surround a portion of the support module SM, and may be connected to the display panel DP and the main circuit board MB. The flexible circuit board CF may electrically connect the display panel DP disposed on an upper surface of the support module SM to the main circuit board MB disposed on a lower surface of the support module SM.

The flexible circuit board CF may be provided in plural, and the flexible circuit boards CF may be arranged in one direction, and each of the flexible circuit boards CF may be electrically connected to the display panel DP. FIG. 2A shows the flexible circuit boards CF arranged in the first direction DR1, however, the present disclosure should not be limited thereto or thereby. The flexible circuit board CF may be provided in a singular number, or some of the flexible circuit boards CF may overlap each other to form a pair, however, they should not be particularly limited.

Referring to FIG. 2B, the support bars SP of the support module SM may include a plurality of first support bars SP-a disposed in the rolling area RA and a second support bar SP-b disposed in the peripheral area SA. The first support bars SP-a may overlap the display area DA and may be connected to each other via the sub-support bars SP-S. The second support bar SP-b may be connected to the first support bar SP-a, which is disposed at an outermost position in the second direction DR2, among the first support bars SP-a connected to each other. In other words, the first support bar SP-a disposed directly adjacent to the peripheral area SA may be connected to the second support bar SP-b.

The main circuit board MB may be disposed on the lower surface of the support module SM. The main circuit board MB may overlap the peripheral area SA and may be disposed on a lower surface of the second support bar SP-b. The second support bar SP-b may directly contact the main circuit board MB. The main circuit board MB may be spaced apart from the first support bars SP-a when viewed in a plane view and may be disposed to overlap the second support bar SP-b.

A signal controller may be mounted on the main circuit board MB. The signal controller may apply a control signal to the display panel DP via the flexible circuit board CF.

The case CS may overlap the peripheral area SA of the support module SM. The case CS may be spaced apart from the display area DA when viewed in a plane view. The case CS may protect the flexible circuit board CF and the main circuit board MB from external impacts and foreign substances.

The case CS may accommodate the flexible circuit board CF and the main circuit board MB. As an example, the case CS may include an upper cover and a lower cover coupled with the upper cover. The upper cover and the lower cover coupled with the upper cover may provide an inner space in which the flexible circuit board CF and the main circuit board MB are accommodated. The case CS should not be particularly limited as long as the case CS may accommodate the flexible circuit board CF and the main circuit board MB.

The display module DM may be disposed on the support module SM to overlap the rolling area RA of the support module SM. The display module DM may include a protective layer PF, the display panel DP, and a window WM.

The display panel DP may provide the image to the user through the display module DM. The display panel DP may be a light-emitting type display panel, however, it should not be particularly limited. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod. Hereinafter, the organic light emitting display panel will be described as the display panel DP.

The display panel DP may include a display substrate DS, a display element layer DL, and an encapsulation layer TFE. The display substrate DS, the display element layer DL, and the encapsulation layer TFE may be sequentially stacked one on another.

The display substrate DS may include a semiconductor layer, a plurality of insulating layers, and a plurality of conductive layers. The display substrate DS may form a scan driving circuit, signal lines, and a pixel control circuit. The display substrate DS may receive electrical signals from the flexible circuit board CF and the main circuit board MB, which are electrically connected thereto.

The display element layer DL may overlap the display area DA of the display module DM and may be disposed on the display substrate DS. The display element layer DL may include the light emitting element and may emit a light to the display surface DM-IS of the display module DM. As an example, the display element layer DL may include the organic light emitting diode.

The encapsulation layer TFE may be disposed on the display element layer DL to cover the display element layer DL. The encapsulation layer TFE may include a plurality of thin films. Some thin films may protect the light emitting element, and some thin films may be disposed to increase a light efficiency.

The window WM may be disposed on the display panel DP. The window WM may protect the display panel DP from external scratches and external impacts.

The window WM may include an optically transparent insulating material. The image generated on the display panel DP may be provided to the user after passing through the window WM. As an example, the window WM may include a polymer substrate, a plastic substrate, a thin glass substrate, or the like. The window WM may have a single-layer or multi-layer structure.

The window WM may include at least one of optical films. The optical films may include at least one of a polarizing film a diffusing film, a protective film, and the like. The window WM may further include a functional coating layer, such as an anti-fingerprint coating layer or an anti-reflective coating layer.

The protective layer PF may be disposed under the display panel DP. The protective layer PF may have a single-layer or multi-layer structure. As an example, the protective layer PF may be a layer including at least one plastic film. For instance, the plastic film may include one selected from the group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly arylene ethersulfone and a combination thereof. However, this is merely an example, and the material for the protective layer PF should not be particularly limited as long as the protective layer PF may have the flexibility and may protect a lower portion of the display panel DP.

The resin layer LR may be disposed between the support module SM and the display module DM. The resin layer LR may be in contact with the upper surface of the support module SM and the lower surface of the display module DM. The resin layer LR may be in contact with the support bars SP included in the support module SM. For example, the resin layer LR may be in direct contact with the first and second support bars SP-a and SP-b.

The resin layer LR may cover an upper surface of the first support bars SP-a disposed in the rolling area RA. The resin layer LR may cover a gap or a boundary between the first support bars SP-a spaced apart from each other, and thus, may provide a flat upper surface to the display module DM. Accordingly, the surface quality of the display module DM disposed on the resin layer LR may be increased.

The resin layer LR may cover at least a portion of an upper surface of the second support bar SP-b disposed in the peripheral area SA, however, it should not be limited thereto or thereby. According to an embodiment of the present disclosure, the resin layer LR may entirely cover the upper surface of the second support bar SP-b.

The resin layer LR may include an elastomer material. The resin layer LR including the elastomer material may be deformed by an external force applied thereto and may be easily returned to its original state when the external force is removed. The resin layer LR may have a modulus equal to or greater than about 1 kPa and equal to or less than about 50 MPa. When the modulus of the resin layer LR is less than about 1 kPa, the shape of the resin layer LR may not be returned to its original state and may be easily deformed or damaged after the external force is removed. When the modulus of the resin layer LR is greater than about 50 MPa, the flexibility of the resin layer LR may be deteriorated, and as a result, the resin layer LR may be broken when being rolled.

Figure 3:
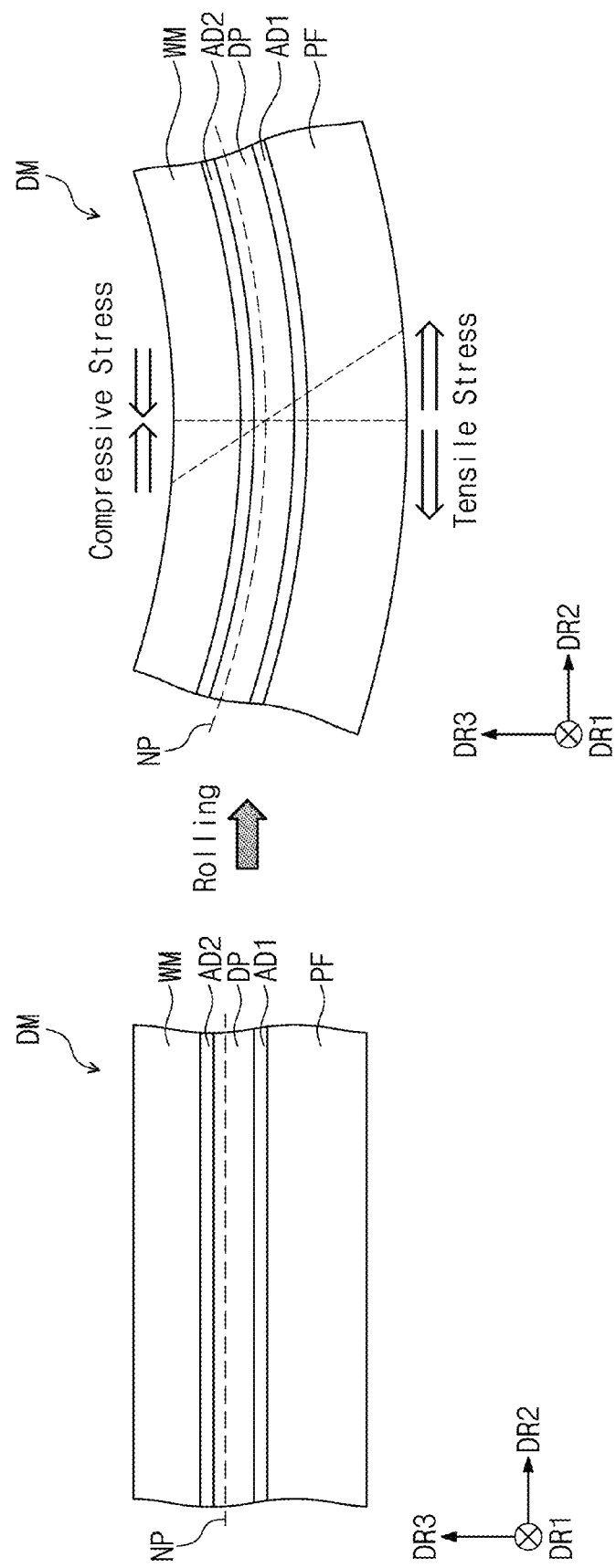
FIG. 3 is a cross-sectional view showing a display module before and after being rolled according to an embodiment of the present disclosure.

FIG. 3 is a cross-sectional view showing the display module DM before and after being rolled according to an embodiment of the present disclosure. Descriptions of the display module DM with reference to FIGS. 2A and 2B may be applied to the display module DM shown in FIG. 3.

Referring to FIG. 3, the display module DM may further include adhesive layers AD1 and AD2. A first adhesive layer AD1 may be disposed between the protective layer PF and the display panel DP. A second adhesive layer AD2 may be disposed between the display panel DP and the window WM. Each of the first adhesive layer AD1 and the second adhesive layer AD2 may include an optical clear adhesive, an optical clear resin, or a pressure sensitive adhesive, which has a light transmitting property.

The components of the display module DM having the multi-layer structure may be rolled with a predetermined radius of curvature. As shown in FIG. 3, when observing an enlarged cross-section of the curved display module DM, a certain portion of the cross-section may be stretched by a tensile stress, and a certain portion of the cross-section may be compressed by a compressive stress. The compressive stress and the tensile stress may be generated relatively.

A plane in which the compressive stress and the tensile stress are in equilibrium on a cross-section may be a neutral plane. The compressive stress may increase as a distance from a center of the curvature in the neutral plane decreases, and the tensile stress may increase as a distance from the center of the curvature in the neutral plane increases.

A position of the neutral plane may be influenced by a material, a structure, a thickness, a modulus, and a Poisson's ratio of the stacked components. According to the position of the neutral plane, some components of the stack structure may receive the tensile stress when being rolled, and some components of the stack structure may receive the compressive stress when being rolled. As the position of the neutral plane of the display module DM is adjusted, the display module DM may be prevented from being damaged by an external stress.

According to an embodiment of the present disclosure, the neutral plane NP of the display module DM may be in the display panel DP. In other words, the neutral plane NP of the display module DM may be located between a lower surface of the display panel DP and an upper surface of the display panel DP. When the display module DM is designed to allow the neutral plane NP to be in the display panel DP, the display panel DP may be prevented from being damaged by the stress applied thereto when being rolled.

The resin layer LR (refer to FIG. 2B) and the display module DM, which are disposed on the support module SM, may be a stack module. The thickness and the modulus of the resin layer LR (refer to FIG. 2B) may exert an influence on the neutral plane of the stack module, however, the influence may be small. In other words, a position of the neutral plane of the stack module including the resin layer LR (refer to FIG. 2B) and the display module DM and a position of the neutral plane of the display module DM may be substantially the same as each other or may be within a margin of error. As an example, the neutral plane of the display module DM and the neutral plane of the stack module may be in the display panel DP, and the positions of the neutral planes may be substantially the same as each other, or a difference between the positions of the neutral planes may be within the margin of error.

Figure 4:
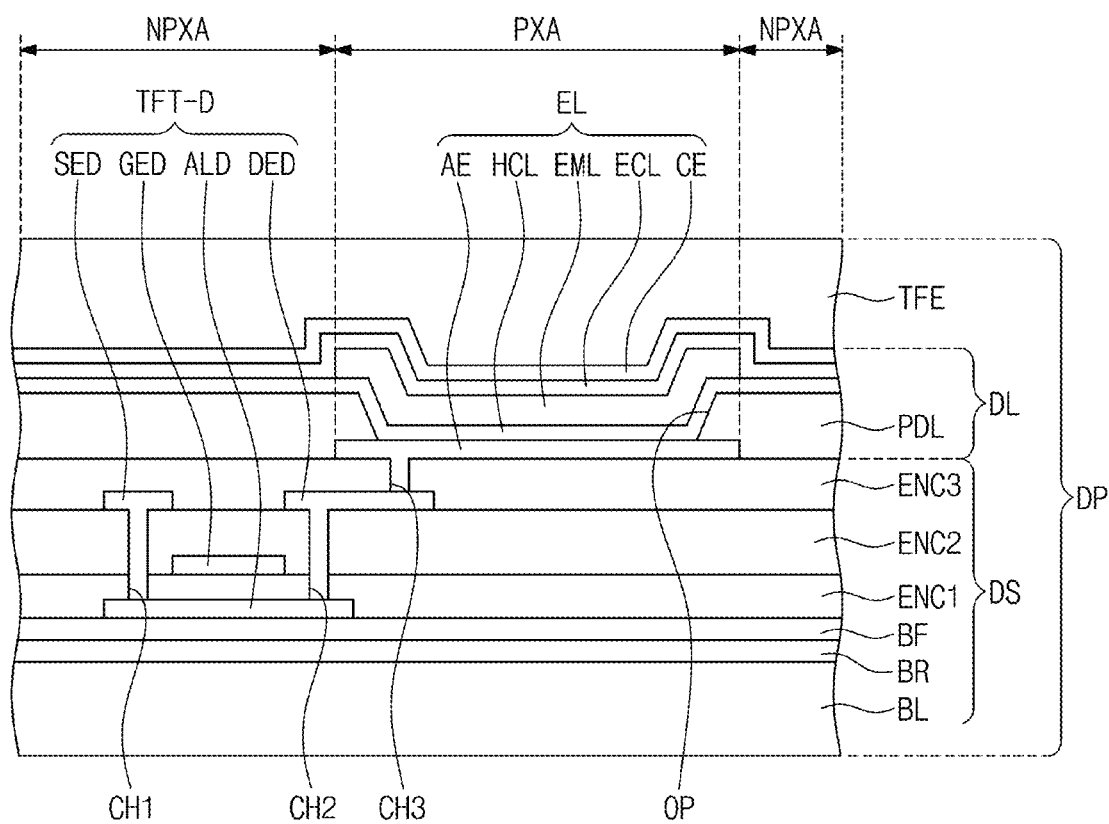
FIG. 4 is a cross-sectional view showing a display panel according to an embodiment of the present disclosure.

FIG. 4 is a cross-sectional view showing the display panel DP according to an embodiment of the present disclosure. The cross-sectional view of the display panel DP shown in FIG. 4 may correspond to one pixel included in the display area DA of the display module DM.

Referring to FIG. 4, the display panel DP may include the display substrate DS, the display element layer DL, and the encapsulation layer TFE. The display substrate DS, the display element layer DL, and the encapsulation layer TFE may be sequentially stacked in the third direction DR3.

The display substrate DS may include a base layer BL, a barrier layer BR, a buffer layer BF, a plurality of insulating layers ENC1, ENC2, and ENC3, a switching transistor, and a driving transistor TFT-D. The barrier layer BR, the buffer layer BF, and the insulating layers ENC1, ENC2, and ENC3 may include one of an inorganic layer and an organic layer.

The base layer BL may be a layer on which a plurality of transistors is disposed. The base layer BL may be a silicon substrate, a plastic substrate, or a glass substrate and may be a stack structure including a plurality of insulating layers. The base layer BL may be flexible.

The barrier layer BR may be disposed on the base layer BL. The barrier layer BR may prevent impurities present in the base layer BL or moisture entering from outside from being diffused to the transistors. The impurities may be gas or sodium generated by a thermal decomposition of the base layer BL.

The buffer layer BF may be disposed on the barrier layer BR. A semiconductor pattern ALD of the driving transistor TFT-D may be disposed on the buffer layer BF. The buffer layer BF may increase an adhesion between the base layer BL and the semiconductor pattern ALD.

The driving transistor TFT-D may include the semiconductor pattern ALD, a control electrode GED, an input electrode SED, and an output electrode DED. The semiconductor pattern ALD may include amorphous silicon, polycrystalline silicon, or a metal oxide semiconductor.

A first insulating layer ENC1 may be disposed on the semiconductor pattern ALD. The first insulating layer ENC1 may cover a portion of the semiconductor pattern ALD. The first insulating layer ENC1 may include at least one organic layer or inorganic layer. As an example, the inorganic layer may be one of a silicon nitride layer and a silicon oxide layer, however, it should not be limited thereto or thereby.

The control electrode GED may be disposed on the first insulating layer ENC1. The control electrode GED may be a gate electrode of the driving transistor TFT-D. A control electrode of the switching transistor may be disposed on the first insulating layer ENC1.

A second insulating layer ENC2 may be disposed on the first insulating layer ENC1 and may cover the control electrode GED. The second insulating layer ENC2 may include at least one organic layer or inorganic layer. As an example, the inorganic layer may be one of the silicon nitride layer or the silicon oxide layer, however, it should not be limited thereto or thereby.

The input electrode SED and the output electrode DED may be disposed on the second insulating layer ENC2. The input electrode SED may be a source electrode of the driving transistor TFT-D and the output electrode DED may be a drain electrode of the driving transistor TFT-D. A input electrode and an output electrode of the switching transistor may be disposed on the second insulating layer ENC2.

The input electrode SED and the output electrode DED may be electrically connected to the semiconductor pattern ALD respectively via a first contact hole CH1 and a second contact hole CH2, which are formed through the first insulating layer ENC1 and the second insulating layer ENC2.

A third insulating layer ENC3 may be disposed on the second insulating layer ENC2 and may cover the input electrode SED and the output electrode DED. The third insulating layer ENC3 may include at least one organic layer or inorganic layer. In particular, the third insulating layer ENC3 may include an organic layer to provide a flat surface.

Each of the second insulating layer ENC2 and the third insulating layer ENC3 may be an interlayer insulating layer. The interlayer insulating layer may insulate a conductive pattern disposed thereunder from a conductive pattern disposed thereon.

The display element layer DL may be disposed on the third insulating layer ENC3. The display element layer DL may include a pixel definition layer PDL and a light emitting element EL. The light emitting element EL may include a first electrode AE, a hole control layer HCL, a light emitting layer EML, an electron control layer ECL, and a second electrode CE.

The display element layer DL may include light emitting areas PXA and a non-light-emitting area NPXA adjacent to the light emitting areas PXA. The light emitting area PXA may be an area from which a light is emitted. The non-light-emitting area NPXA may surround the light emitting area PXA.

The first electrode AE may be disposed on the third insulating layer ENC3. The first electrode AE may be electrically connected to the output electrode DED of the driving transistor TFT-D via a third contact hole CH3 formed through the third insulating layer ENC3.

The pixel definition layer PDL may be provided with an opening OP therethrough. A portion of the first electrode AE may be exposed through the opening OP of the pixel definition layer PDL. The opening OP of the pixel definition layer PDL may correspond to the light emitting areas PXA. In the present embodiment, the light emitting areas PXA may correspond to areas of the first electrode AE exposed through the opening OP.

The hole control layer HCL may be commonly disposed over the light emitting area PXA and the non-light-emitting area NPXA. The hole control layer HCL may be commonly formed in the pixels.

The light emitting layer EML may be disposed on the hole control layer HCL. The light emitting layer EML may be disposed in an area corresponding to the opening OP of the pixel definition layer PDL. In other words, the light emitting layer EML may be provided in a pattern to correspond to the opening OP, however, it should not be limited thereto or thereby. According to an embodiment of the present disclosure, the light emitting layer EML may be commonly disposed over the pixels.

The light emitting layer EML may generate a light. As an example, the light emitting layer EML may generate a white light or a blue light. The light emitting layer EML may include an organic material or an inorganic material as its light emitting material. As an example, the light emitting layer EML may include at least one of an organic compound and an organometallic compound as its light emitting material, however, it should not be limited thereto or thereby. According to an embodiment of the present disclosure, the light emitting layer EML may include a quantum dot as its light emitting material.

The electron control layer ECL may be disposed on the light emitting layer EML. The second electrode CE may be disposed on the electron control layer ECL. The electron control layer ECL and the second electrode CE may be commonly disposed over the light emitting area PXA and the non-light-emitting area NPXA.

The encapsulation layer TFE may encapsulate the display element layer DL. As an example, the encapsulation layer TFE may directly cover the second electrode CE. However, the display panel DP may further include a capping layer disposed on the display element layer DL to cover the second electrode CE, and in this case, the encapsulation layer TFE may directly cover the capping layer.

The encapsulation layer TFE may include an organic layer and an inorganic layer. In FIG. 4, the encapsulation layer TFE having a single-layer structure is shown, however, the encapsulation layer TFE may have a multi-layer structure in which the inorganic layer and the organic layer are sequentially stacked. For example, the encapsulation layer TFE may have a structure in which the organic layer is disposed between the inorganic layers.

The display module DM may further include an input sensing layer disposed on the encapsulation layer TFE. The input sensing layer may sense various types of external inputs, such as a user's hand, heat, light, etc. The input sensing layer may include a plurality of conductive layers and a plurality of insulating layers. The input sensing layer may be disposed directly on the encapsulation layer TFE or may be disposed on the encapsulation layer TFE with an adhesive film interposed therebetween.

The neutral plane NP (refer to FIG. 3) of the display module DM may be influenced by a thickness, a material, a modulus, and an arrangement structure of each of various components included in the display panel DP. The position of the neutral plane NP (refer to FIG. 3) of the display module DM may be changed depending on each component included in the display panel DP. In other words, the neutral plane NP (refer to FIG. 3) may move in the third direction DR3 depending on the number of components included in the display panel DP. As an example, each component of the display panel DP and the display module DM may be designed so that the neutral plane NP (refer to FIG. 3) of the display module DM is adjacent to the encapsulation layer TFE included in the display panel DP, or each component of the display panel DP and the display module DM may be designed so that the neutral plane NP (refer to FIG. 3) of the display module DM is in the encapsulation layer TFE.

Figure 5:
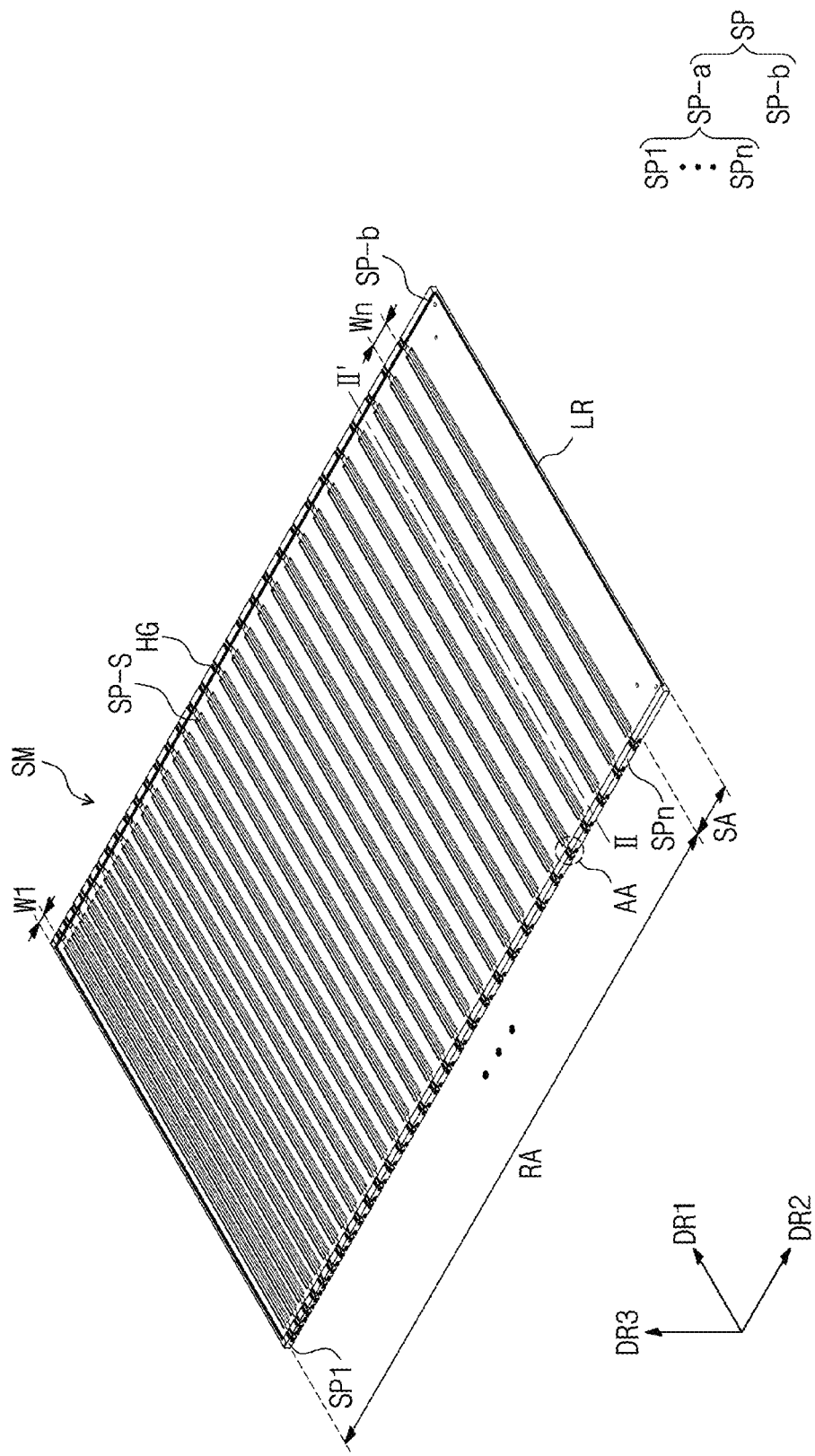
FIG. 5 is a perspective view showing some components of a rollable display device according to an embodiment of the present disclosure.
Figure 6:
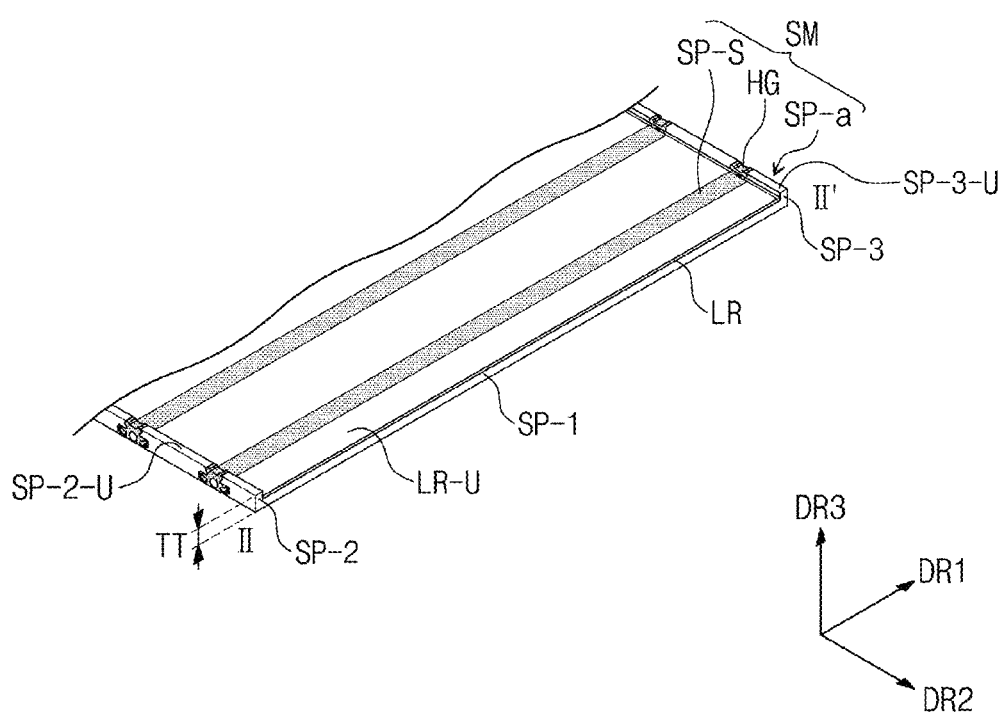
FIG. 6 is a cross-sectional view taken along a line II-II' shown in FIG. 5 according to an embodiment of the present disclosure.
Figure 7A:
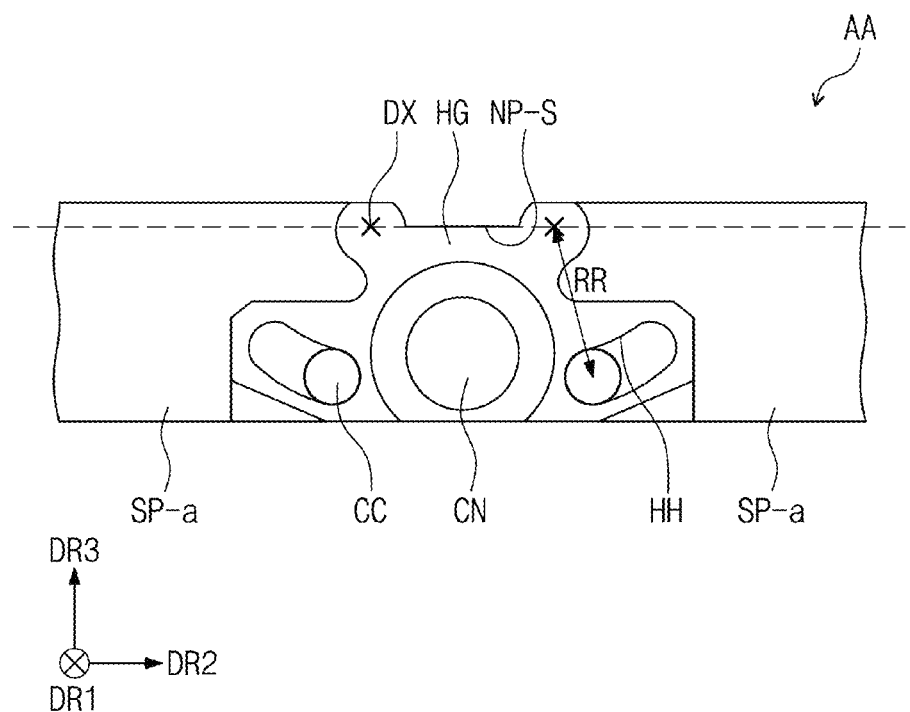
FIG. 7A is a cross-sectional view showing some components of a rollable display device in a flat state corresponding to a partial area shown in FIG. 5.
Figure 7B:
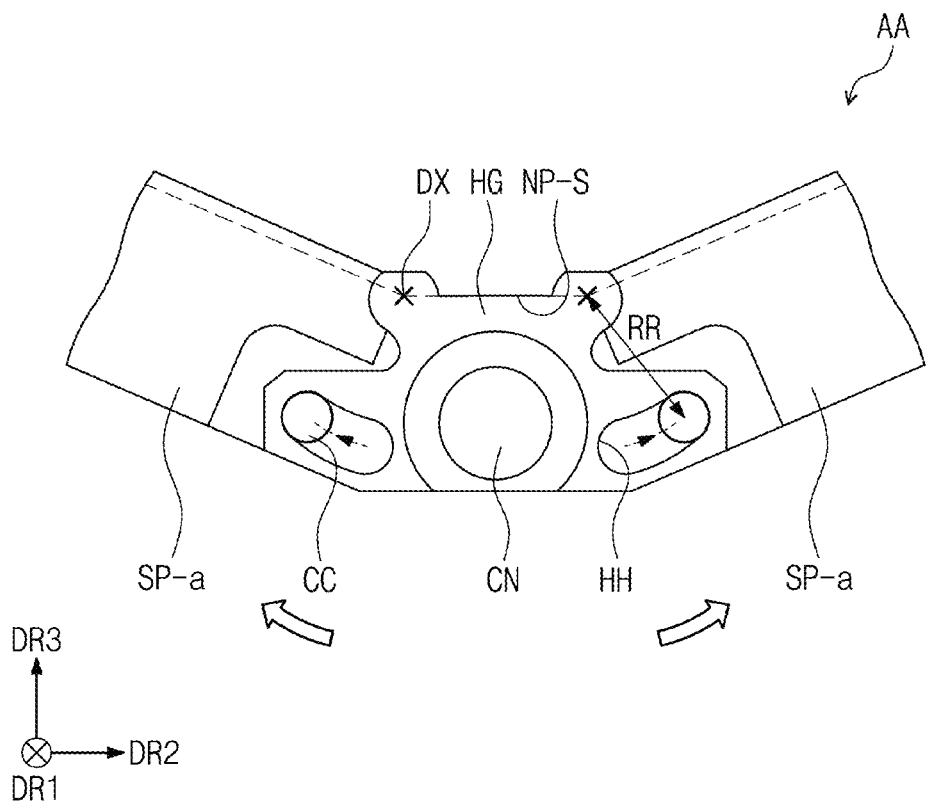
FIG. 7B is a cross-sectional view showing some components of a rollable display device in a rolled state corresponding to a partial area shown in FIG. 5.

FIG. 5 is a perspective view showing some components of the rollable display device according to an embodiment of the present disclosure. FIG. 5 shows the support module SM and the resin layer LR disposed on the support module SM. For the convenience of explanation, the resin layer LR is shown as a transparent layer. FIG. 6 is a cross-sectional view taken along a line II-II' shown in FIG. 5 according to an embodiment of the present disclosure. FIGS. 7A and 7B are enlarged cross-sectional views showing an area AA shown in FIG. 5.

Referring to FIGS. 5 and 6, the support module SM may include the support bars SP, the hinges HG, and the sub-support bars SP-S, and the resin layer LR may be disposed on the support module SM. The descriptions of the above-described elements may be equally applied to the same elements.

The support bars SP may extend in the first direction DR1 and may be arranged in the second direction DR2 crossing the first direction DR1. The support bars SP may be spaced apart from each other at predetermined intervals. As an example, the support bars SP adjacent to each other may be spaced apart from each other with the sub-support bar SP-S interposed therebetween in the second direction DR2, however, they should not be limited thereto or thereby. According to an embodiment of the present disclosure, the support bars SP may be partially in contact with the support bars SP adjacent to each other in the second direction DR2 when the support module SM is in the flat state.

The support bars SP may include the first support bars SP-a disposed in the rolling area RA and the second support bar SP-b disposed in the peripheral area SA. One first support bar SP-a (e.g., first support bar SPn of FIG. 5) disposed at an outermost position among the first support bars SP-a along the second direction DR2 may be connected to the second support bar SP-b by the hinges HG. The second support bar SP-b may be wider than each of the first support bars SP-a, however, the present disclosure is not limited thereto.

The first support bars SP-a may include n (n is a natural number) number of support bars. The n first support bars SP-a may be arranged in the second direction DR2. Hereinafter, for the convenience of explanation, in the flat state, the first support bar SP-a among the first support bars SP-a disposed farthest from the second support bar SP-b in the second direction DR2 is referred to as a No. 1 support bar SP1, and the first support bar SP-a among the first support bars SP-a disposed closest to the second support bar SP-b in the second direction DR2 is referred to as an No. n support bar SPn.

The first support bars SP-a disposed in the rolling area RA may have different widths from each other. In the present disclosure, the width of the support bar may be a length of a short side, which extends in the second direction DR2, of the support bar. The widths of the first support bars SP-a may gradually increase as a distance from the second support bar SP-b decreases.

For example, the No. 1 support bar SP1 may have a first width W1, and the No. n support bar SPn may have an n-th width Wn. A difference between the widths of the other first support bars SP-a and the first width W1 may increase as a distance in the second direction DR2 from the first support bar SP1 increases. The first width W1 may be the smallest width among the widths of the first support bars SP-a, and the n-th width Wn may be the largest width among the widths of the first support bars SP-a.

Referring to FIG. 6, each of the first support bars SP-a may include a first portion SP-1, a second portion SP-2 bent from one side of the first portion SP-1, and a third portion SP-3 bent from the other side of the first portion SP-1. The second portion SP-2 and the third portion SP-3 may face each other in the first direction DR1. The second portion SP-2 and the third portion SP-3 may be higher than the first portion SP-1 in the third direction DR3.

The display module DM (refer to FIG. 1A) may be disposed between the second portions SP-2 and the third portions SP-3 of the first support bars SP-a. An upper surface of the first portion SP-1 may face the lower surface of the display module DM disposed on the support module SM. An inner surface of the second portion SP-2 may face one side surface of the display module DM disposed on the support module SM. An inner surface of the third portion SP-3 may face the other side surface of the display module DM, which is opposite to the one side surface of the display module DM. In other words, the inner surfaces of the second and third portions SP-2 and SP-3 may face opposite side surfaces of the display module DM and fix the display module DM in place.

The support module SM may have a thickness TT corresponding to a distance from a lowermost surface to an uppermost surface of the first support bars SP-a, which is defined in the third direction DR3. The lowermost surface of the first support bar SP-a may be a lower surface of the first portion SP-1 of the first support bar SP-a. The uppermost surface of the first support bar SP-a may be an upper surface SP-2-U of the second portion SP-2 and an upper surface SP-3-U of the third portion SP-3.

Each of the hinges HG may connect the first support bars SP-a adjacent to each other. The hinges HG may be disposed in spaces between the first support bars SP-a coupled with the hinges HG. As an example, the hinges HG may be disposed between the second portions SP-2 spaced apart from each other or between the third portions SP-3 spaced apart from each other of the first support bars SP-a adjacent to each other in the second direction DR2. In this case, the hinges HG may be parallel to each other.

However, according to an embodiment of the present disclosure, each of the hinges HG may be disposed on an outer surface of the support bars SP, may be coupled with the support bars SP, and may protrude from the outer surface of the support bars SP. In the alternative, each of the hinges HG may be disposed on an inner surface of the support bars SP. The shape of the hinges HG should not be particularly limited as long as the hinges HG may be coupled with the support bars SP and may move the support bars SP coupled therewith with respect to the driving axis DX (refer to FIGS. 7A and 7B).

The resin layer LR may cover the upper surfaces of the first portions SP-1 of the first support bars SP-a and the upper surfaces of the sub-support bars SP-S. In other words, the resin layer LR may cover the area between the second portions SP-2 and the third portions SP-3 of the first support bars SP-a. The upper surface of the support module SM, which corresponds to the upper surfaces of the first portions SP-1 and the upper surfaces of the sub-support bars SP-S may be uneven due to a distance and a step difference between the first support bars SP-a and the sub-support bars SP-S. Since the resin layer LR of the present disclosure covers the upper surfaces of the first portions SP-1 of the first support bars SP-a and the upper surfaces of the sub-support bars SP-S, a flat upper surface LR-U may be provided to the display module DM, and the surface quality of the display module DM may be increased.

The upper surface of the display module DM (refer to FIG. 2B) disposed on the resin layer LR may meet with the upper surface SP-2-U of the second portion SP-2 of the first support bars SP-a and the upper surface SP-3-U of the third portion SP-3 of the first support bars SP-a when viewed in a cross-section. In other words, the thickness of the display module DM may be substantially the same as a height between the flat upper surface LR-U of the resin layer LR and the upper surface SP-2-U of the second portion SP-2. In other words, a top of the display module DM may be at the same level as the upper surface SP-2-U of the second portion SP-2 of the first support bars SP-a and the upper surface SP-3-U of the third portion SP-3 of the first support bars SP-a.

FIG. 7A is a cross-sectional view showing a portion of the support module in the flat state, and FIG. 7B is a cross-sectional view showing the support module of FIG. 7A in the rolled state. FIGS. 7A and 7B show one hinge HG among the hinges HG and two first support bars SP-a coupled with the one hinge HG.

Referring to FIG. 7A, each of the first support bars SP-a may include a coupling portion CC. The coupling portion CC may protrude in the first direction DR1 from an outer surface of the second portion SP-2 and the third portion SP-3 of the first support bar SP-a substantially parallel to a surface formed by the second direction DR2 and the third direction DR3. For example, the coupling portion CC may have the shape of a cylinder. However, the shape of the coupling portion CC should not be limited thereto or thereby.

The coupling portion CC may include the same material as the second portion SP-2 and the third portion SP-3 of the first support bar SP-a and may be provided integrally with the second portion SP-2 and the third portion SP-3, however, it should not be limited thereto or thereby. According to an embodiment of the present disclosure, the coupling portion CC may include a material different from that of the second portion SP-2 and the third portion SP-3 of the first support bar SP-a.

The hinge HG may be provided with a coupling recess HH. The coupling portion CC of the first support bar SP-a may be inserted into the coupling recess HH of the hinge HG, and thus, the first support bar SP-a may be coupled with the hinge HG. One hinge HG may be provided with two coupling recesses HH. The coupling portions CC of the support bars SP-a adjacent to each other may be inserted into the coupling recesses HH, respectively. For example, the coupling portion CC of a first support bar may be inserted into a first coupling recess of a hinge HG and the coupling portion CC of a second support bar adjacent to the first support bar may be inserted into a second coupling recess of the hinge HG. The coupling portion CC of the first support bar SP-a, which is coupled with the hinge HG, may move along a shape of the coupling recess HH.

The hinge HG may include a coupling part CN coupled with the sub-support bar SP-S (refer to FIG. 6). The coupling part CN may overlap the sub-support bar SP-S (refer to FIG. 6) when viewed in the first direction DR1. The hinge HG and the sub-support bar SP-S (refer to FIG. 6) may be coupled with each other by a screw or by a recess and a protrusion, which have shapes corresponding to each other. The shape of the coupling part CN should not be particularly limited as long as the hinge HG and the sub-support bar SP-S (refer to FIG. 6) may be coupled with each other by the coupling part CN.

Referring to FIG. 7B, when the support module SM is rolled, each of the first support bars SP-a may be rotated with respect to the driving axis DX extending in the first direction DR1. For example, the first support bars SP-a may move along the coupling recess HH to correspond to the shape of the coupling recess HH. Each of the first support bars SP-a may move from the driving axis DX by a predetermined arc of a circle with a predetermined radius of curvature RR with respect to the driving axis DX. The radius of curvature RR may be a straight line from the driving axis DX to a center of the coupling portion CC when viewed in a side view.

The driving axis DX of the support module SM may penetrate the display module DM disposed on the support module SM when viewed in cross-section. For example, the driving axis DX may penetrate the display panel DP when viewed in a cross-section. The driving axis DX of the support module SM may be at the same position as that of the neutral plane NP (refer to FIG. 3) of the display module DM when viewed in cross-section. In other words, a height from the lower surface of the display module DM disposed on the support module SM to the neutral plane NP (refer to FIG. 3) of the display module DM may be substantially the same as a height from the lower surface of the display module DM to the driving axis DX.

In a stack structure in which two or more layers having different moduli from each other are stacked, a neutral plane of the stack structure may be adjacent to a layer having a relatively high modulus with respect to a center of the stack structure when viewed in a cross-section.

The first support bars SP-a may be rotated with respect to the driving axes DX respectively defined in the first support bars SP-a, and the support module SM may be rolled with respect to the rolling axis spaced apart from the driving axes DX by the first support bars SP-a, which are rotated with respect to the driving axes DX. An imaginary plane NP-S connecting the driving axes DX may be a plane whose length is not changed in the support module SM. As such, the driving axes DX may be fixed in place. The modulus of the support module SM may be greater than the modulus of each stack structure included in the display module DM. Accordingly, the neutral plane of the rollable display device DD may be provided at a position that is closer to the imaginary plane NP-S connecting the driving axes DX of the support module SM than the neutral plane NP (refer to FIG. 3) of the display module DM.

The display module DM and the support module SM may be designed such that the neutral plane NP (refer to FIG. 3) of the display module DM is provided at the same position as that of the driving axes DX when viewed in cross-section. Since the neutral plane of the rollable display device DD, which is adjacent to the driving axes DX of the support module SM, is close to or coincides with the neutral plane NP (refer to FIG. 3) of the display module DM, a degree to which the display module DM is damaged by a strain in the rolling operation may be reduced. As the damage of the display module DM is reduced, the reliability of the rollable display device DD may be increased.

For example, the neutral plane NP (refer to FIG. 3) of the display module DM may be provided in the display panel DP by controlling a thickness and a modulus of each component of the protective layer PF, the display panel DP, and the window WM of the display module DM. When the display module DM is rolled, each component of the display panel DP adjacent to the neutral plane NP (refer to FIG. 3) of the display module DM when viewed in cross-section may receive a relatively smaller strain than that applied to the window WM and the protective layer PF, which are relatively far from the neutral plane NP (refer to FIG. 3) of the display module DM. Accordingly, the light emitting element and the circuits included in the display panel DP may not be damaged or may be less damaged by the strain.

In addition, the driving axis DX of the support module SM may be changed depending on a thickness, an arrangement, and a shape of each component, such as the support bars SP, the hinges HG, etc. As shown in FIGS. 7A and 7B, the driving axis DX may be provided to penetrate the hinge HG when viewed in a side view, however, it should not be limited thereto or thereby.

Figure 8A:
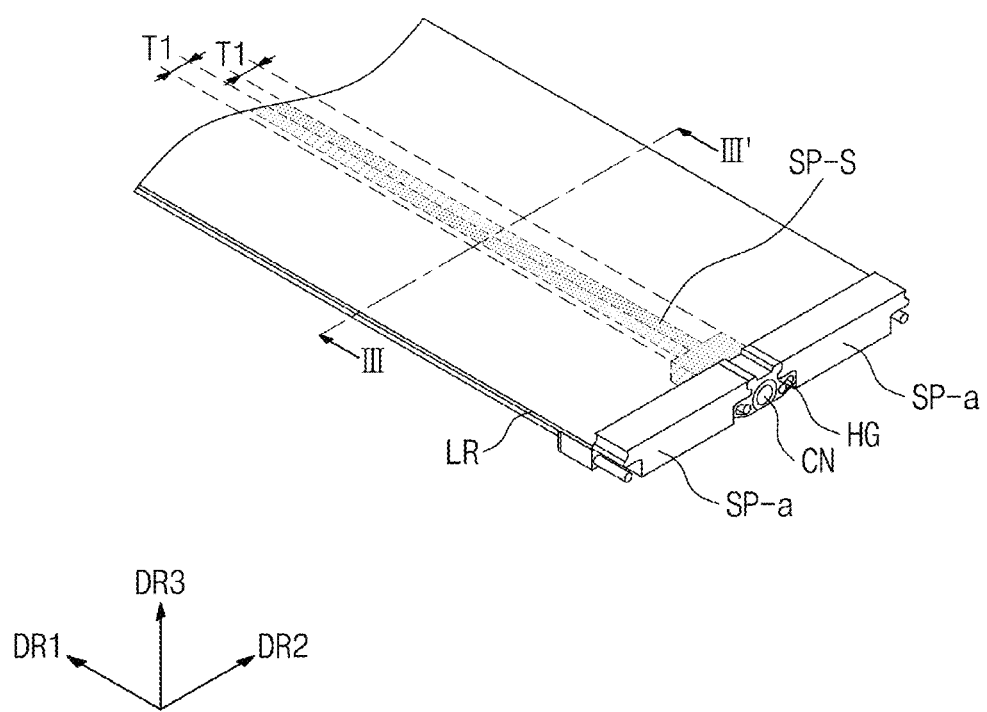
FIG. 8A is a perspective view showing some components of a rollable display device in a flat state according to an embodiment of the present disclosure.
Figure 8B:
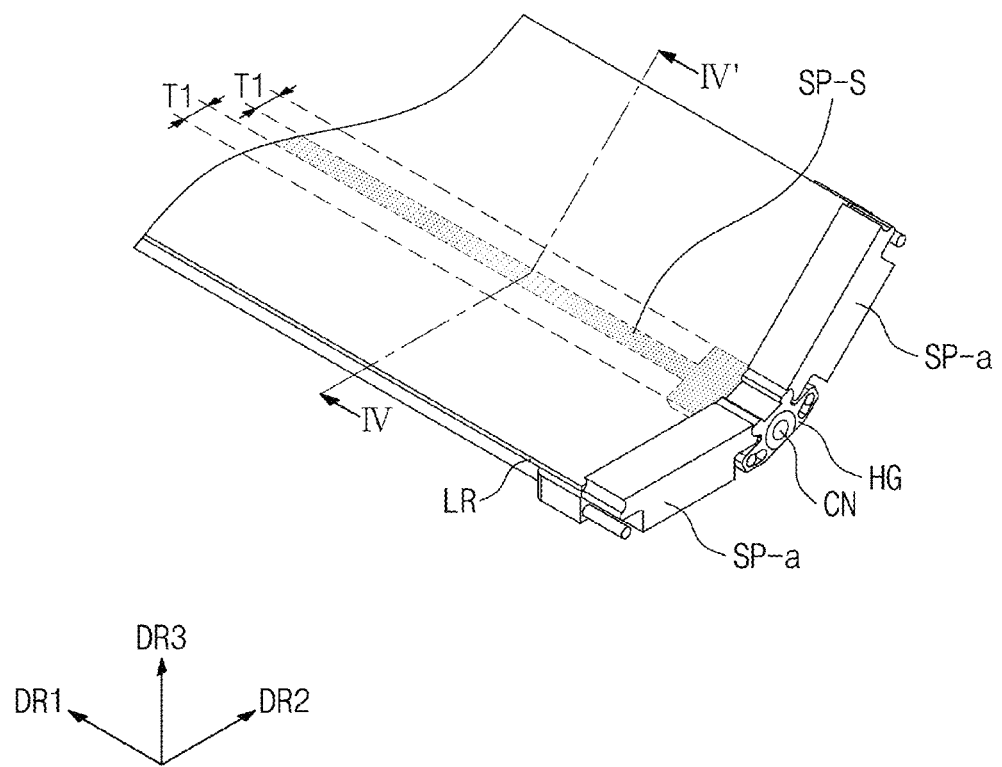
FIG. 8B is a perspective view showing some components of a rollable display device in a rolled state according to an embodiment of the present disclosure.

FIG. 8A is a perspective view showing a portion of the support module SM and the resin layer LR in the flat state according to an embodiment of the present disclosure. FIG. 8B is a perspective view showing a portion of the support module SM and the resin layer LR in the rolled state according to an embodiment of the present disclosure. FIGS. 8A and 8B show one hinge HG among the hinges HG and one sub-support bar SP-S and two first support bars SP-a, which are coupled with the hinge HG.

Referring to FIGS. 8A and 8B, the first support bars SP-a adjacent to each other may be spaced apart from each other by a predetermined distance. As an example, one first support bar SP-a and another first support bar SP-a adjacent to the one first support bar SP-a may be spaced apart from each other with the sub-support bar SP-S interposed therebetween. The first support bars SP-a may be spaced apart from the sub-support bar SP-S by a first distance T1 in the second direction DR2. As an example, the first distance T1 may be equal to or less than about 1 mm. However, the first distance T1 may be equal to or greater than about 1 mm without being limited thereto or thereby. The first distance T1 may correspond to a gap between the one first support bar SP-a and the sub-support bar SP-S, for example.

FIG. 9A is a cross-sectional view taken along a line III-III' shown in FIG. 8A to show the support module SM and the resin layer LR according to an embodiment of the present disclosure. FIG. 9B is a cross-sectional view taken along a line IV-IV' shown in FIG. 8B to show the support module SM and the resin layer LR according to an embodiment of the present disclosure.

Referring to FIG. 9A, the resin layer LR may cover the upper surface of the sub-support bar SP-S and the upper surfaces of the first support bars SP-a. The resin layer LR may cover a gap between the sub-support bar SP-S and the first support bars SP-a adjacent to the sub-support bar SP-S to provide the flat upper surface.

Referring to FIG. 9B, when the support module SM is rolled, the distance between the sub-support bar SP-S and the first support bars SP-a adjacent to the sub-support bar SP-S may increase compared with that in the flat state as a distance from the resin layer LR increases. The resin layer LR may cover the gap, and thus, the surface quality of the display module DM disposed on the resin layer LR may be increased. However, when the support module SM is rolled, the stress may be concentrated at portions 10 of the resin layer LR, which are adjacent to corners of the first support bars SP-a.

FIG. 10A is a cross-sectional view taken along a line III-III' shown in FIG. 8A to show a support module SM and a resin layer LR according to an embodiment of the present disclosure. FIG. 10B is a cross-sectional view taken along a line IV-IV' shown in FIG. 8B to show the support module SM and the resin layer LR according to an embodiment of the present disclosure. The support module SM shown in FIGS. 10A and 10B have substantially the same configurations as the support module SM shown in FIGS. 9A and 9B except some components.

Referring to FIGS. 10A and 10B, the support module SM may further include a bonding portion LM filled in a space between a sub-support bar SP-S and a first support bar SP-a adjacent to the sub-support bar SP-S in the second direction DR2. The bonding portion LM may be in contact with one surface of the sub-support bar SP-S and one surface of the first support bar SP-a, which faces the one surface of the sub-support bar SP-S.

The bonding portion LM may include a resin. The bonding portion LM may include an elastomer material. The bonding portion LM may have a modulus equal to or less than about 50 MPa. In detail, the bonding portion LM may have a modulus equal to or greater than about 1 kPa and equal to or less than about 50 MPa. When the modulus of the bonding portion LM is less than about 1 kPa, the shape of the bonding portion LM, which is deformed by the rolling operation, may not be returned to its original state and may be easily deformed or damaged. When the modulus of the bonding portion LM is greater than about 50 MPa, the flexibility of the bonding portion LM may be deteriorated, and as a result, the bonding portion LM may be broken when being rolled.

The bonding portion LM may include the same material as that of the resin layer LR. As shown in FIG. 10A, the bonding portion LM may be in contact with a portion of the resin layer LR. As shown in FIG. 10B, the bonding portion LM may be provided integrally with the resin layer LR. In this case, the resin layer LR may be formed to fill the gap between the sub-support bar SP-S and the first support bar SP-a adjacent to the sub-support bar SP-S.

The bonding portion LM and the resin layer LR may be substantially simultaneously formed through the same process, however, they should not be limited thereto or thereby. According to an embodiment of the present disclosure, the bonding portion LM and the resin layer LR may be separately formed through processes that are sequentially performed. As an example, the bonding portion LM may be formed through a separate resin coating and curing process before the resin layer LR is formed. After the bonding portion LM is formed, the resin layer LR may be formed through a resin coating and curing process.

Referring to FIG. 10B, the bonding portion LM may be in contact with the resin layer LR and corners of the first support bars SP-a. When the support module SM is rolled, the bonding portion LM may be tensioned as a gap between the sub-support bar SP-S and the first support bars SP-a adjacent to the sub-support bar SP-S increases. The bonding portion LM may prevent the stress from being concentrated at portions 20 of the resin layer LR adjacent to the corners of the first support bars SP-a, and thus, the resin layer LR may be prevented from being damaged.

Figure 11A:
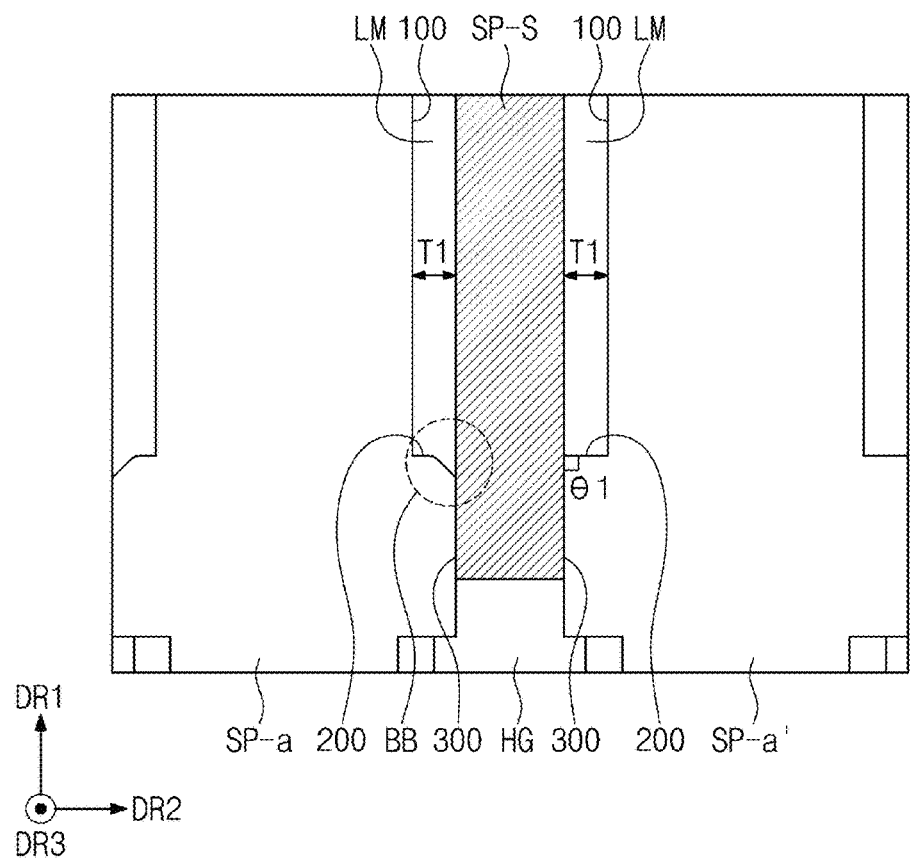
FIG. 11A is a plan view showing a portion of a support module according to an embodiment of the present disclosure.
Figure 11B:
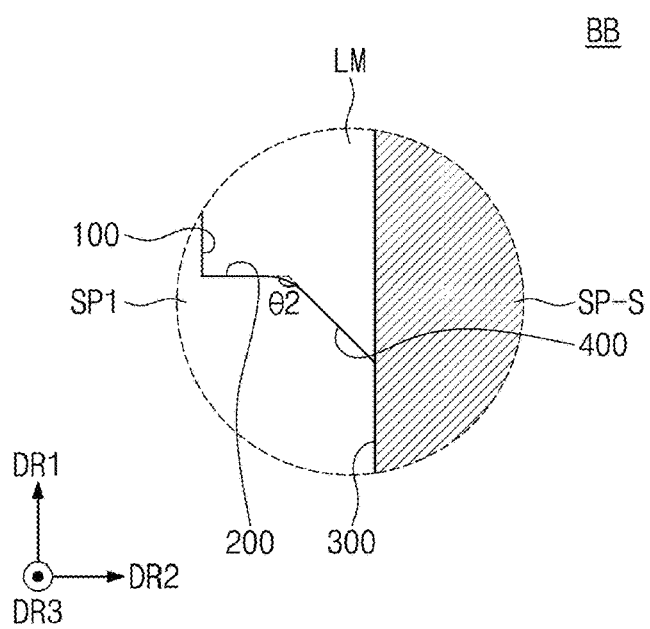
FIG. 11B is an enlarged view showing an area shown in FIG. 11A.

FIG. 11A is a plan view showing a portion of a support module according to an embodiment of the present disclosure. FIG. 11B is an enlarged view showing an area BB shown in FIG. 11A. FIG. 11A shows one sub-support bar SP-S and two first support bars SP-a and SP-a' adjacent to the sub-support bar SP-S. For the convenience of explanation, the two first support bars SP-a and SP-a' having different shapes from each other are shown, however, the first support bars included in one support module SM may have the same shape as each other.

Referring to FIG. 11A, the first support bars SP-a and SP-a' may include a plurality of surfaces that is in contact with the bonding portion LM. Each of the first support bars SP-a and SP-a' may include a first surface 100 substantially parallel to a long side of the first support bar SP-a and SP-a', which extends in the first direction DR1, and a second surface 200 bent from the first surface 100. The first surface 100 and the second surface 200 may be in contact with the bonding portion LM. The first support bars SP-a and SP-a' may each include a third surface 300 facing one surface of the sub-support bar SP-S, and the third surface 300 may be substantially parallel to the first surface 100. The second surface 200 may be connected to the first surface 100 and the third surface 300. According to an embodiment of the present disclosure, an angle (θ1) between the second surface 200 and the third surface 300 of the first support bar SP-a' may be a right angle.

Referring to FIG. 11B, according to an embodiment of the present disclosure, the first support bar SP-a may further include a fourth surface 400 that is in contact with the bonding portion LM and connected to the second surface 200 and the third surface 300. The fourth surface 400 may be bent from the second surface 200. In other words, the fourth surface 400 may be slanted with respect to the second surface 200 and the third surface 300. An angle (θ2) between the second surface 200 and the fourth surface 400 may be an obtuse angle. The angle (θ2) may be greater than the angle (θ1). The fourth surface 400 may be a surface that is substantially parallel to one direction or that includes a curved surface. The portion of the bonding portion LM that is in contact with the support bar SP-a may be prevented from being damaged by the first support bar SP-a including at least one curved surface that is in contact with the bonding portion LM.

Figure 12A:
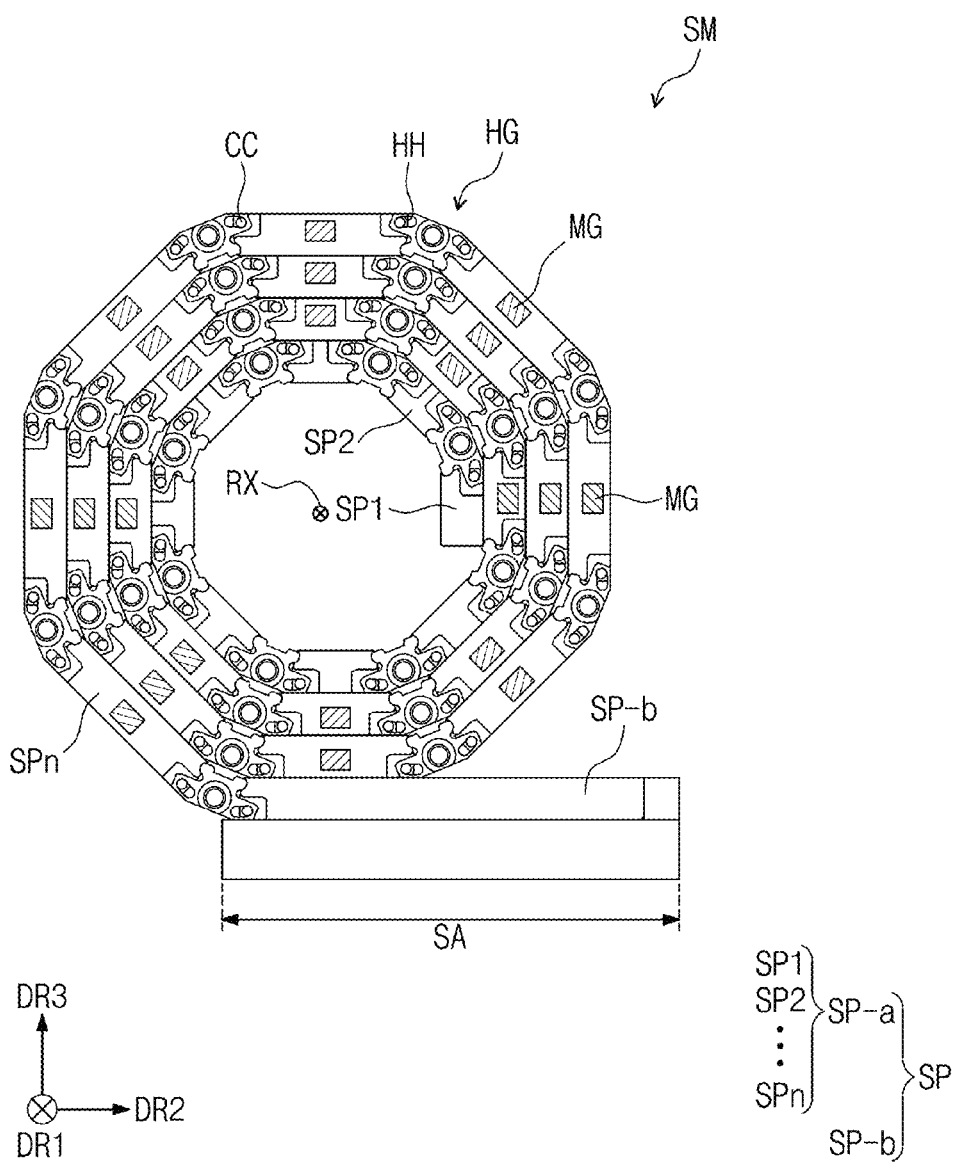
FIG. 12A is a side view showing a support module in a rolled state according to an embodiment of the present disclosure.
Figure 12B:
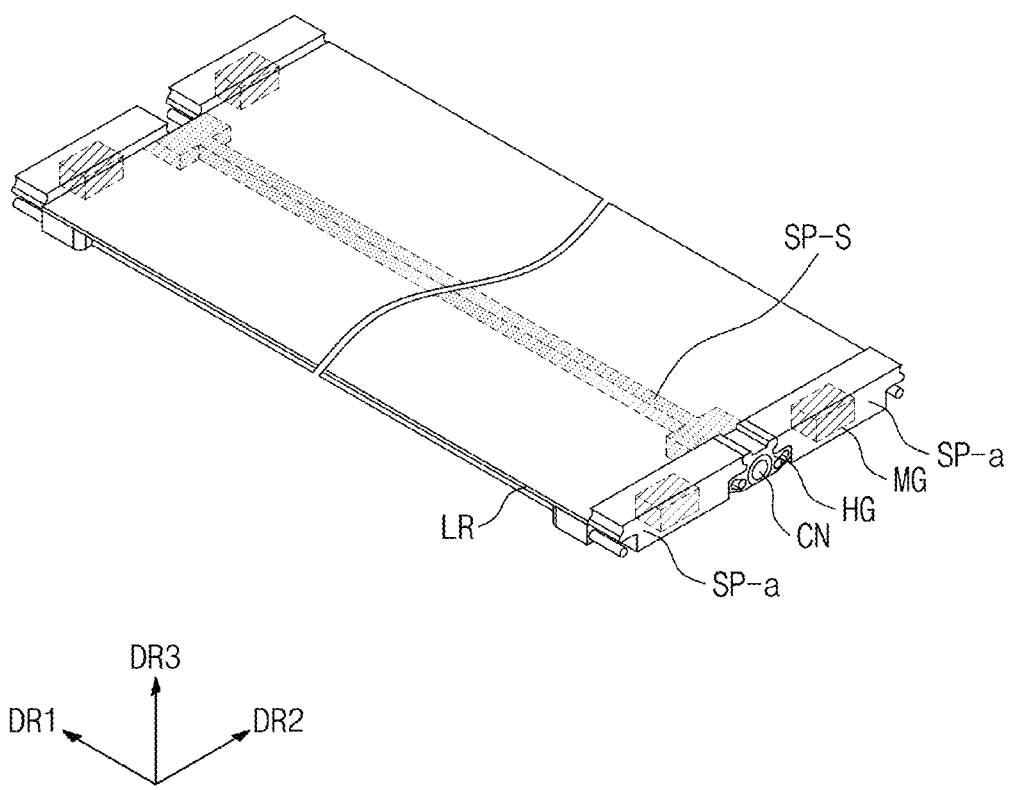
FIG. 12B is a perspective view showing some components of a rollable display device in a flat state according to an embodiment of the present disclosure.
Figure 13:
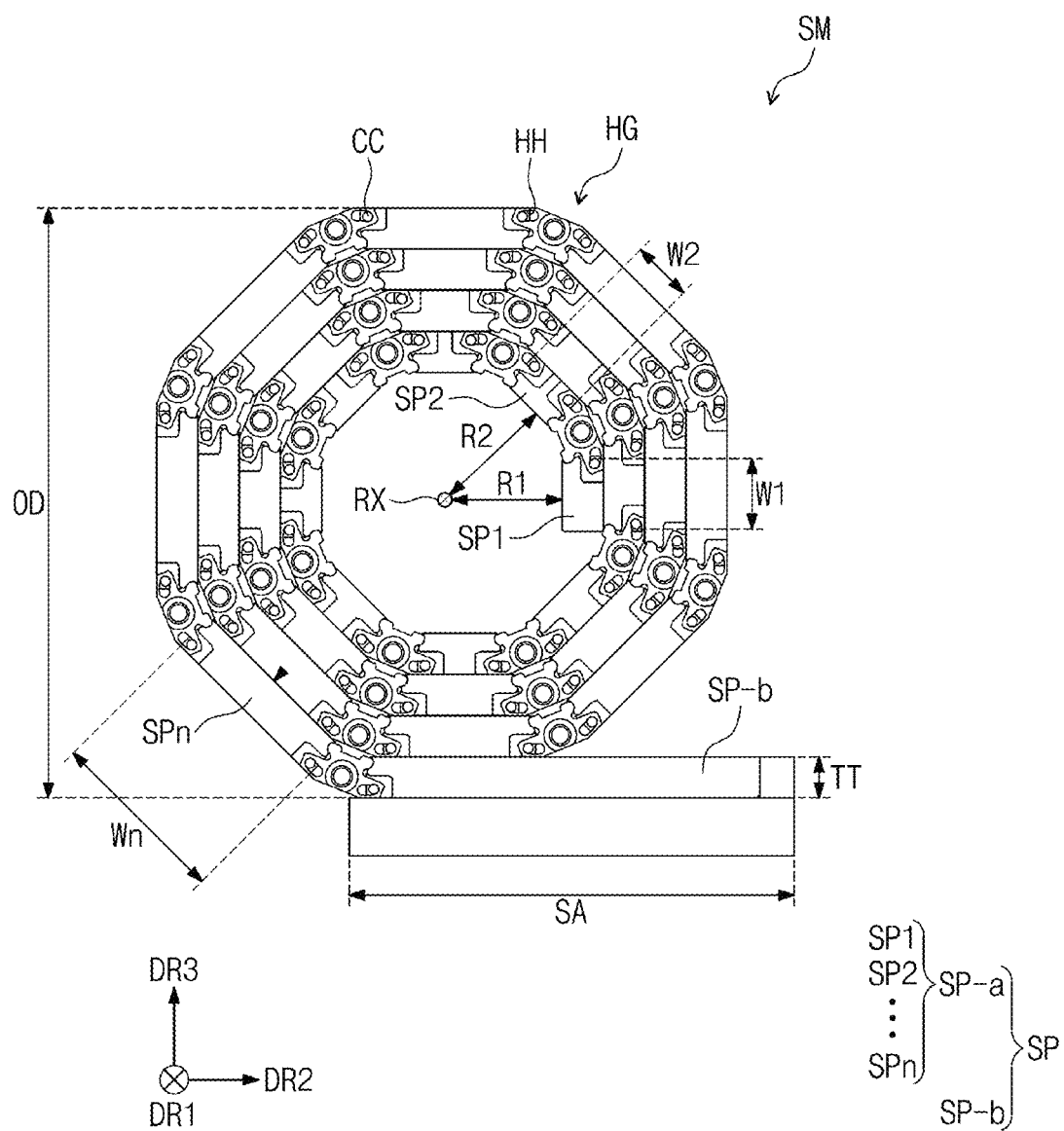
FIG. 13 is a side view showing a support module in a rolled state module according to an embodiment of the present disclosure.

FIGS. 12A and 13 are side views showing support modules SM in a rolled state according to an embodiment of the present disclosure. FIG. 12B is a perspective view showing some components of the support module SM shown in FIG. 12A. In FIGS. 12A, 12B, and 13, the same reference numerals denote the same elements, and thus, the descriptions of the above-described elements may be equally applied to the same elements.

Referring to FIGS. 12A and 13, in the support module SM in the rolled state, the first support bar SP-a, which is disposed closest to the rolling axis RX, among the first support bars SP-a in the rolling area RA may correspond to the No. 1 support bar SP1 disposed farthest from the second support bar SP-b shown in FIG. 5, and the first support bar SP-a disposed farthest from the rolling axis RX may correspond to the No. n support bar SPn disposed closest to the second support bar SP-b.

The support module SM may be rolled with respect to the imaginary rolling axis RX. The rolling axis RX may be spaced apart from the driving axis DX and may extend in the first direction DR1. As an example, FIG. 12A shows the support module SM rolled in an octagonal shape when viewed in a side view, however, the support module SM should not be limited thereto or thereby. According to an embodiment of the present disclosure, the support module SM may be rolled in a polygonal shape whose number of sides is smaller than 8 or greater than 8.

Referring to FIGS. 12A and 12B, the support module SM may further include magnets MG inserted into at least some first support bars SP-a among the first support bars SP-a. FIG. 12B is a perspective view showing some first support bars SP-a each into which the magnets MG are inserted.

FIG. 12A shows the support module SM in which the magnet MG is inserted into some support bars among the first support bars SP-a. Since the first support bars SP-a have different widths from each other, the width of the some support bars may not be sufficient to accommodate the magnet MG, and thus, some support bars may not include the magnet MG. As an example, referring to FIG. 12A, among the first support bars SP-a rolled in the octagonal shape, the No. 1 support bar SP1 to a No. 8 support bar, which are rolled closest to the rolling axis RX, may not include the magnet MG, and a No. 9 support bar to the No. n support bar SPn may include the magnet MG, however, they should not be limited thereto or thereby. In other words, the support bars closest to the rolling axis RX may not include the magnet MG. According to an embodiment of the present disclosure, all the first support bars SP-a may include the magnet MG or may include a smaller number of magnets MG than that shown in FIG. 12A.

In the rolled state, some magnets MG among the magnets MG respectively inserted into the first support bars SP-a may be substantially parallel to each other in one direction. As an example, referring to FIG. 12A, four first support bars SP-a may be stacked from the rolling axis RX to the one direction to be substantially parallel to each other. The magnets MG inserted into the first support bars SP-a, which are stacked in the one direction to be substantially parallel to each other, may be substantially parallel to each other. For example, in the support module SM rolled in the octagonal shape, the magnet MG included in the No. 9 support bar, the magnet MG included in a No. 17 support bar, and the magnet MG included in a No. 25 support bar may be substantially parallel to each other in the one direction. For example, the magnet MG included in the No. 9 support bar, the magnet MG included in the No. 17 support bar, and the magnet MG included in a No. 25 support bar may be substantially parallel to each other in the third direction DR3 in the rolled state.

According to an embodiment of the present disclosure, the support module SM may further include the bonding portion LM (refer to FIG. 10B) that is tensioned in the rolling operation, and the bonding portion LM may have a property of returning to its original state before being tensioned by a restoration force. According to an embodiment of the present disclosure, since the support module SM may further include the magnets MG inserted into at least some support bars among the first support bars SP-a, the support module SM may be stably rolled by an attractive force between the magnets MG.

Referring to FIG. 12B, the magnets MG may be spaced apart from the display area DA of the display module DM when viewed in a plane view. One first support bar SP-a may include at least one magnet MG. As an example, FIG. 12B shows two magnets MG inserted into one first support bar SP-a. The magnets MG included in the one first support bar SP-a may be spaced apart from each other in the first direction DR1.

Referring to FIG. 13, the widths of the first support bars SP-a disposed in the rolling area RA may vary depending on the radius of curvature in the rolling operation. The widths of the first support bars SP-a may increase as a distance from the rolling axis RX increases. The first width W1 of the No. 1 support bar SP1 disposed closest to the rolling axis RX may be the smallest among the widths of the first support bars SP-a. The n-th width Wn of the No. n support bar SPn disposed farthest from the rolling axis RX may be the largest among the widths of the first support bars SP-a.

The radius of curvature in the rolling operation may increase as a distance from the rolling axis RX increases. As the radius of curvature increases, the width of the first support bar SP-a may be relatively large. The first width W1 of the No. 1 support bar SP1 rolled at a first radius of curvature R1 may be smaller than a second width W2 of a No. 2 support bar SP2 rolled at a second radius of curvature R2 greater than the first radius of curvature R1.

According to an embodiment of the present disclosure, a length, an outer diameter, and a thickness of the rolling area RA of the support module SM may have a correlation with the number and width of the support bars SP-a arranged in the rolling area RA.

In the present disclosure, the length of the rolling area RA of the support module SM may correspond to a length of the rolling area RA in the second direction DR2 crossing the direction of the rolling axis RX of the support module SM in the flat state. Referring to FIG. 5, the length of the rolling area RA of the support module SM may correspond to a total length from the No. 1 support bar SP1 to the No. n support bar SPn arranged along the second direction DR2 in the flat state. The length of the rolling area RA of the support module SM may satisfy the following Equation 1.

$$L = x \cdot a + \frac{x \cdot b(x-1)}{2} \qquad \text{Equation 1}$$

In Equation 1, L denotes the length of the rolling area RA of the support module SM. In Equation 1, x denotes the number of the first support bars SP-a included in the support module SM, a denotes the smallest width among the widths of the first support bars SP-a, and b denotes a difference in width between the first support bars SP-a adjacent to each other. As an example, a may be the first width W1 of the No. 1 support bar SP1 having the smallest width, and b may be the difference in width between the first width W1 of the No. 1 support bar SP1 and the second width W2 of the No. 2 support bar SP2 adjacent to the No. 1 support bar SP1.

The outer diameter OD of the support module SM may correspond to an outermost diameter of the support module SM in the rolled state. The outer diameter OD of the support module SM may correspond to a length from a lower surface of one support bar to a lower surface of another support bar, which are disposed farthest from the rolling axis RX and face each other in the third direction DR3, among the rolled first support bars SP-a. The outer diameter OD of the support module SM may be substantially the same as an outer diameter of the rollable display device DD in the rolled state. The outer diameter OD of the support module SM may satisfy the following Equation 2.

$$D = (\sqrt{2}+1) \cdot \{a + (5+x)b\} \qquad \text{Equation 2}$$

In Equation 2, D denotes the outer diameter OD of the support module SM. In Equation 2, x, a, and b may be substantially the same as x, a, and b in Equation 1, respectively.

Details on the thickness TT of the support module SM described with reference to FIG. 6 may be equally applied to the thickness TT of the support module SM of FIG. 13. The thickness TT of the support module SM may satisfy the following Equation 3.

$$T = 4(\sqrt{2}+1)b \qquad \text{Equation 3}$$

In Equation 3, T denotes the thickness TT of the support module SM. In Equation 3, x, a, and b may be substantially the same as x, a, and b in Equation 1, respectively.

An embodiment of the present disclosure provides a rollable display device DD including: a support module SM; a display module DM disposed on the support module SM and including a display area DA and a non-display area NDA adjacent to the display area DA; and a resin layer LR disposed between the support module SM and the display module DM, the display module DM including a display panel DP including a plurality of pixels, the support module SM including: a plurality of support bars SP-a extending in a first direction DR1 and arranged in a second direction DR2 crossing the first direction DR1, wherein the support bars SP-a are spaced apart from each other; and a plurality of hinges HG disposed between the support bars SP-a and coupled with the support bars SP-a disposed adjacent thereto, and wherein each of the support bars SP-a is rotatably coupled with the hinges HG with respect to a driving axis DX extending in the first direction DR1.

Figure 14A:
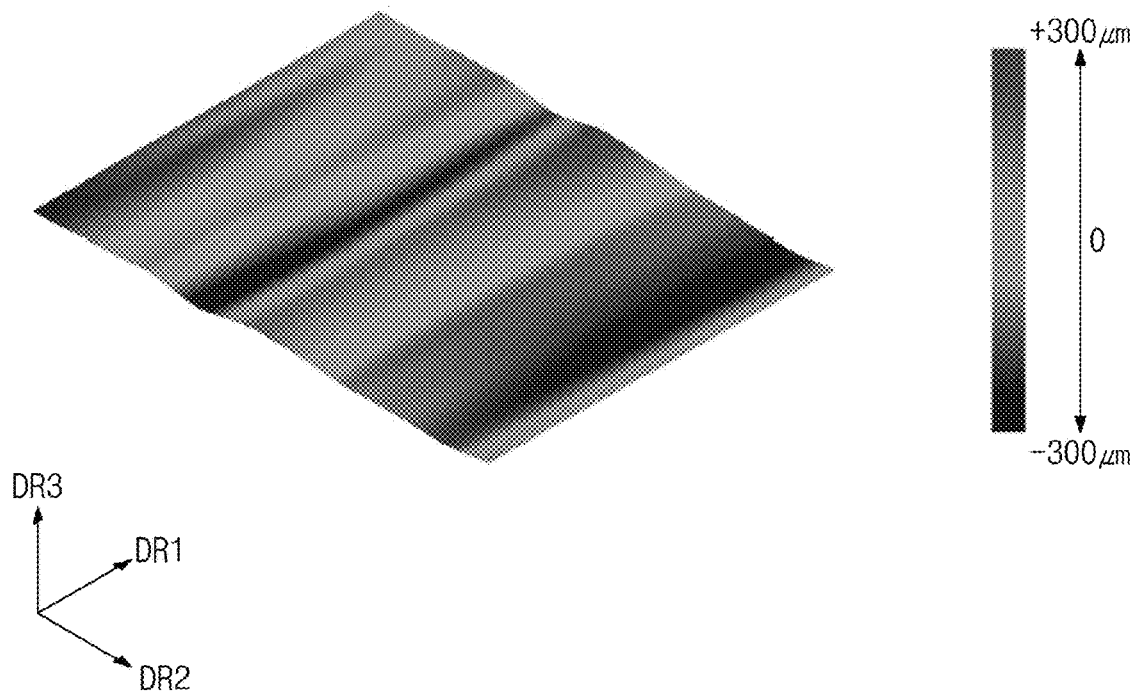
FIG. 14A is a scanning electron microscope (SEM) color image showing surface quality characteristics of a comparative example.
Figure 14B:
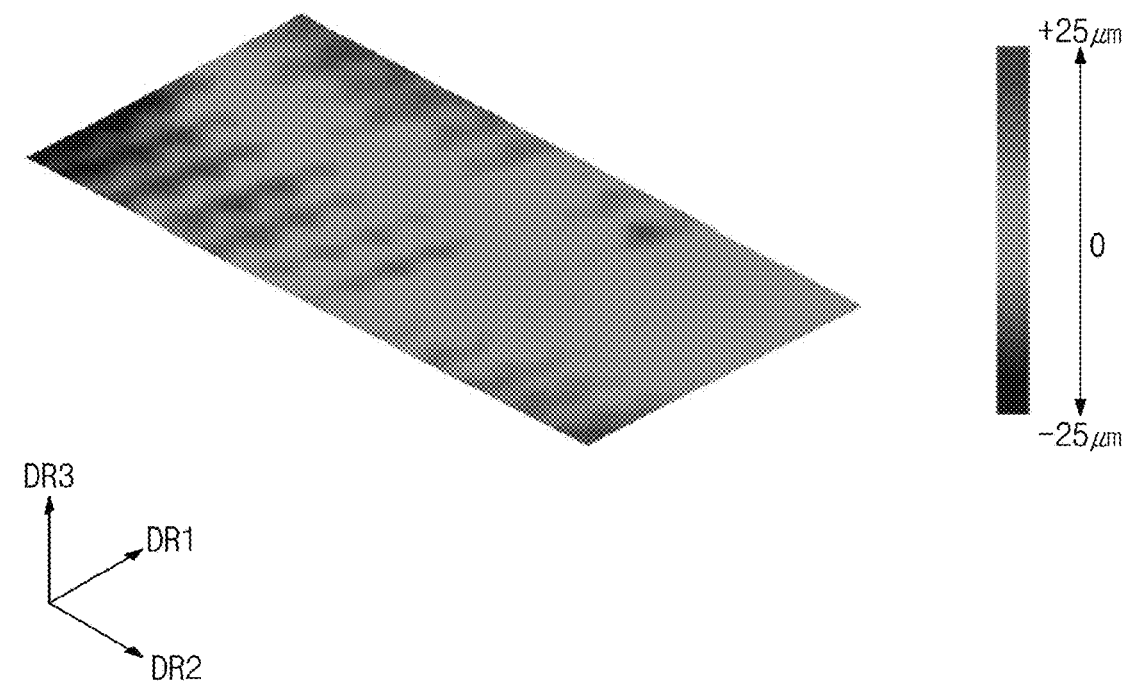
FIG. 14B is a SEM color image showing surface quality characteristics of an example of an embodiment of the present disclosure.
Figure 14C:
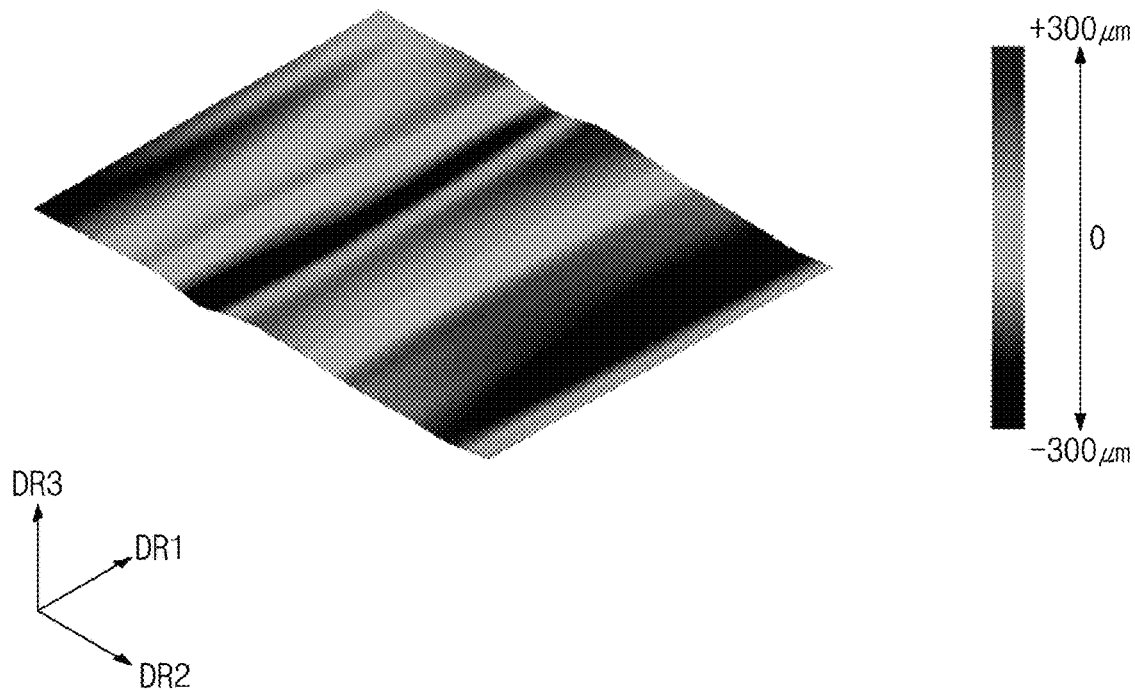
FIG. 14C is a black and white image of the SEM image shown in FIG. 14A.
Figure 14D:
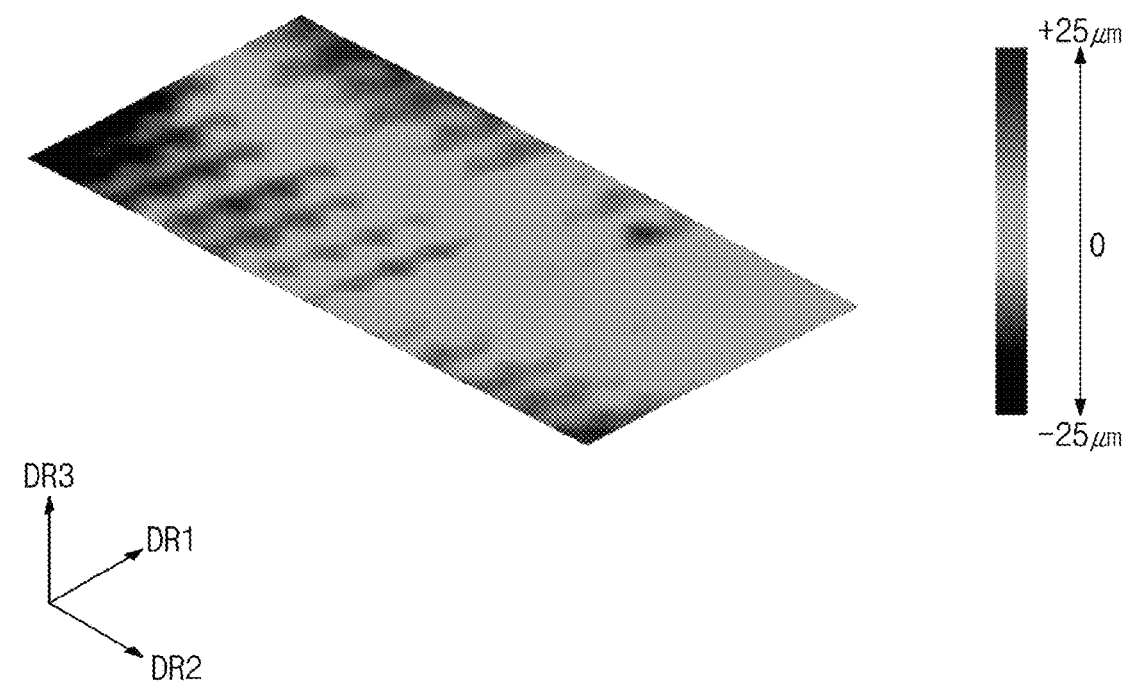
FIG. 14D is a black and white image of the SEM image shown in FIG. 14B.
Figure 15A:
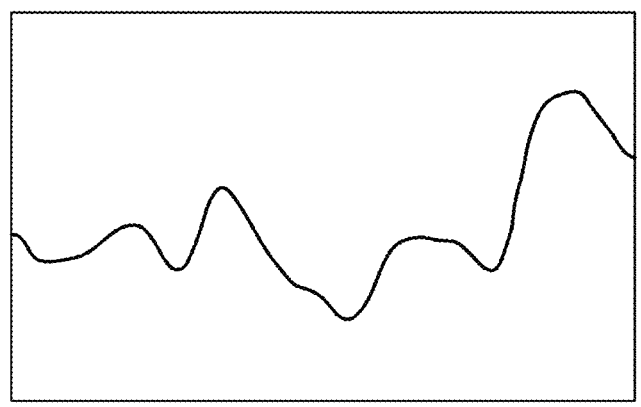
FIG. 15A is a graph showing surface quality characteristics of a comparative example.
Figure 15B:
FIG. 15B is a graph showing surface quality characteristics of an example of an embodiment of the present disclosure.

FIGS. 14A and 14B are scanning electron microscope (SEM) color images showing surface quality characteristics of a comparative example and an example of an embodiment of the present disclosure. FIG. 14C is an image obtained by converting FIG. 14A to black and white, and FIG. 14D is an image obtained by converting FIG. 14B to black and white. FIGS. 15A and 15B are graphs showing the surface quality characteristics of the comparative example and the example of the embodiment of the present disclosure.

FIG. 14A is the SEM color image showing the surface quality characteristics of the comparative example (FIG. 14C is the black and white SEM image of FIG. 14A), and FIG. 14B is the SEM color image showing the surface quality characteristics of the example of the embodiment of the present disclosure (FIG. 14D is the black and white SFM image of FIG. 14B). The comparative example corresponds to a rollable display device in which a resin layer is not disposed between a support module and a display module, and the example of the embodiment of the present disclosure corresponds to the rollable display device DD in which the resin layer LR is disposed between the support module SM and the display module DM. In each of the images shown in FIGS. 14A and 14B, a degree of difference in height with respect to a reference surface corresponding to zero (0) of a bar graph shown on the right is expressed in various colors. In FIGS. 14C and 14D, the degree of difference in height with respect to the reference surface corresponding to zero (0) of a bar graph shown on the right is expressed in various shadows Referring to FIGS. 14A and 14B, the reference surface is expressed as a green color (referring to FIGS. 14C and 14D, the reference surface is expressed as relatively light gray shade), a portion protruding in the third direction DR3 from the reference surface is expressed as a red color, and a portion recessed in the third direction DR3 from the reference surface is expressed as a blue color (referring to FIGS. 14C and 14D, the portion protruding or recessed from the reference surface is expressed as relatively dark black shade). Since an area of the green color (or an area of the light gray shade shown FIG. 14C and FIG. 14D) corresponding to the reference surface increases, an area of the protruded or recessed portion may decrease, and the surface quality characteristics of the rollable display device may be superior.

When comparing FIG. 14A with FIG. 14B (or comparing FIG. 14C with FIG. 14D), it is observed that the area of the red portion protruded from the reference surface or the area of the blue portion recessed from the reference surface in FIG. 14B (or the area of the portion protruded or recessed from the reference surface expressed as the dark black shade in FIG. 14D) is smaller than those in FIG. 14A (or those in FIG. 14C). This may mean that the surface quality characteristics of the rollable display device according to the embodiment example shown in FIG. 14B (or shown in FIG. 14D) is relatively superior.

In addition, it is observed that a maximum protruded portion or a maximum recessed portion in the rollable display device of the comparative example has a height of about 300 μm and a maximum protruded portion or a maximum recessed portion in the rollable display device of the example of the embodiment of the present disclosure has a height of about 25 μm relative to the reference surface. Accordingly, the rollable display device of the example of the embodiment of the present disclosure and the rollable display device of the comparative example may have a difference in height of about 250 μm or more in the protruded or recessed portion.

FIGS. 15A and 15B are graphs showing a protruded or recessed degree of the rollable display device when viewed in a side view formed by the second direction DR2 and the third direction DR3. A horizontal axis of the graphs may correspond to the second direction DR2, and a vertical axis of the graphs may correspond to the third direction DR3. The flatter the shape shown in the graphs, the better the surface quality characteristics.

FIG. 15A is the graph showing the surface quality characteristics of the comparative example, and FIG. 15B is the graph showing the surface quality characteristics of the example of the embodiment of the present disclosure. Descriptions of the comparative example and the example of the embodiment of the present disclosure are the same as those described with reference to FIGS. 14A and 14B.

Referring to FIGS. 15A and 15B, when compared with the comparative example, the rollable display device of the example of the embodiment of the present disclosure has relatively few protruded or recessed portions relative to the reference surface, and the protruded or recessed degree is also relatively small. This may mean that the surface quality characteristics of the rollable display device of the example of the embodiment of the present disclosure is relatively superior.

Accordingly, the surface quality characteristics of the rollable display device including the resin layer that provides the flat upper surface between the support module and the display module may be increased. The rollable display device having the increased surface quality characteristics may provide the image with superior quality to the user.

Figure 16:
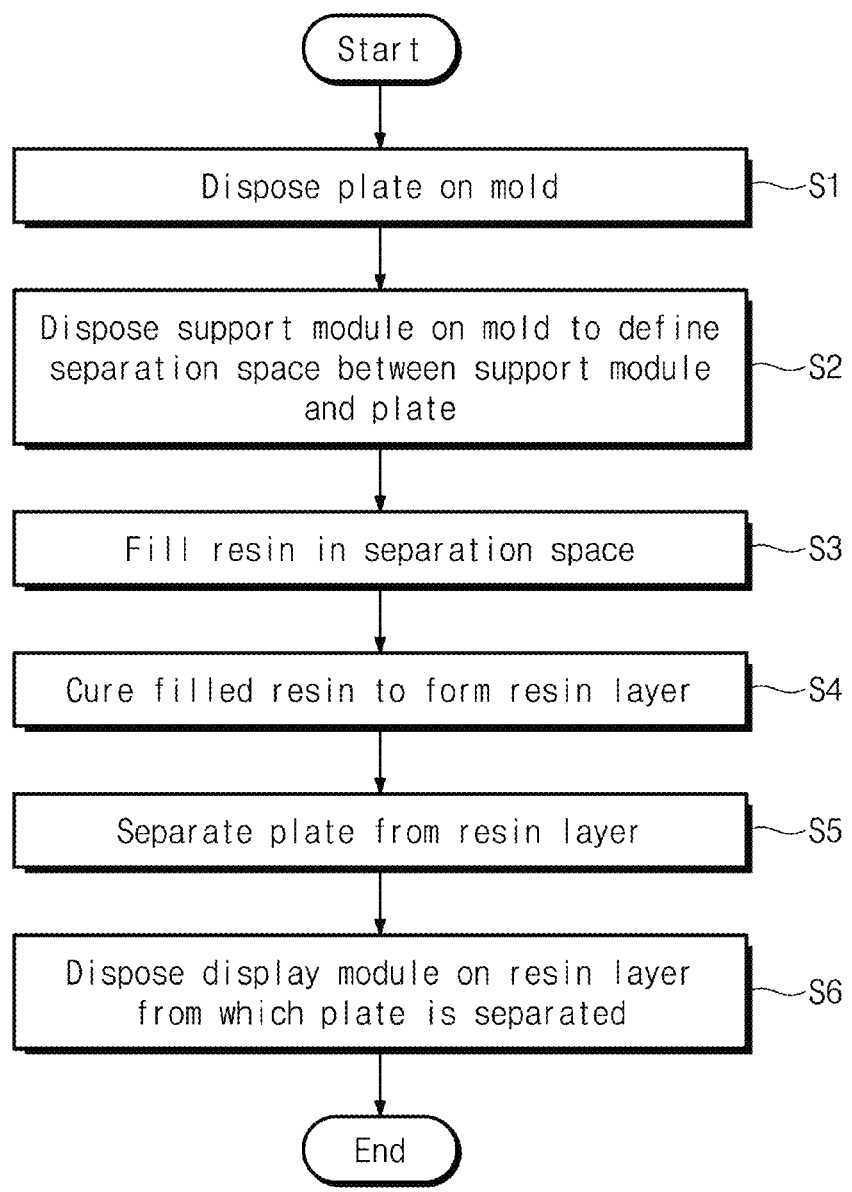
FIG. 16 is a flowchart showing a method of manufacturing a rollable display device according to an embodiment of the present disclosure.

FIG. 16 is a flowchart showing a method of manufacturing the rollable display device according to an embodiment of the present disclosure. The manufacturing method of the rollable display device may include disposing a plate on a mold (S1), disposing the support module on the mold to define a separation space between the support module and the plate (S2), filling a resin in the separation space (S3), curing the filled resin to form the resin layer (S4), separating the plate from the resin layer (S5), and disposing the display module on the resin layer from which the plate is separated (S6).

Figure 17A:
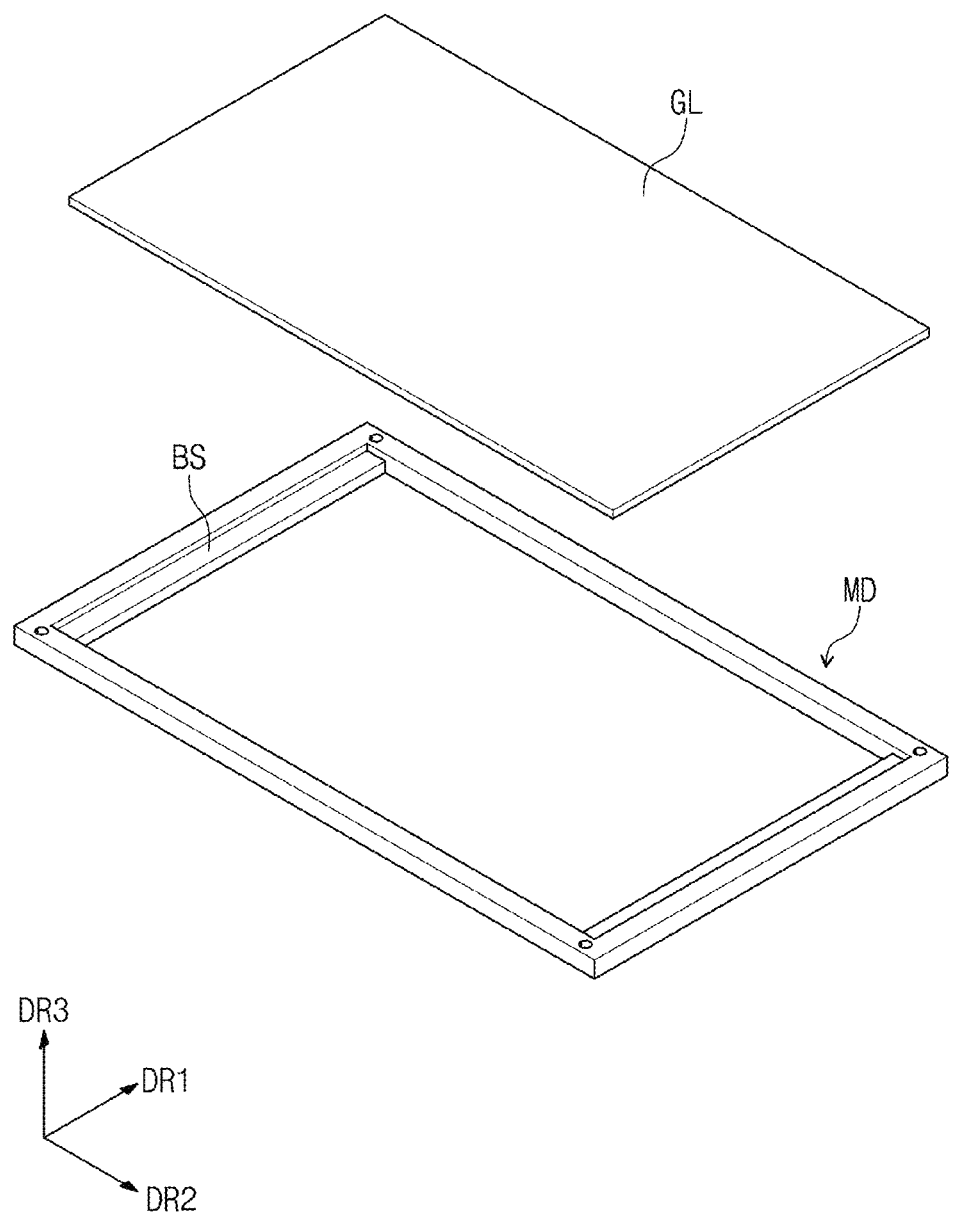
FIGS. 17A, 17B, and 17C are perspective views showing a method of manufacturing a rollable display device according to an embodiment of the present disclosure.
Figure 17B:
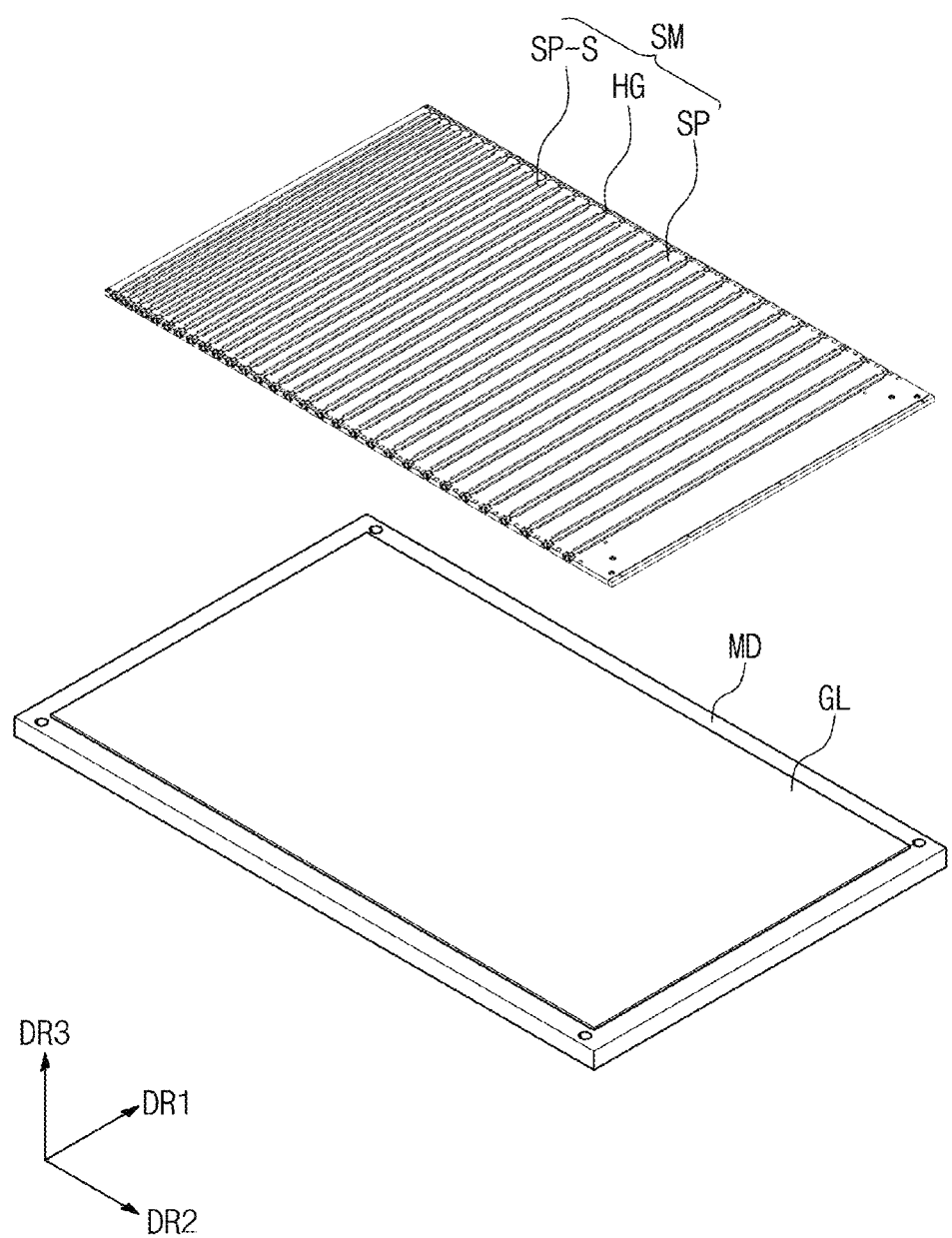
Figure 17C:
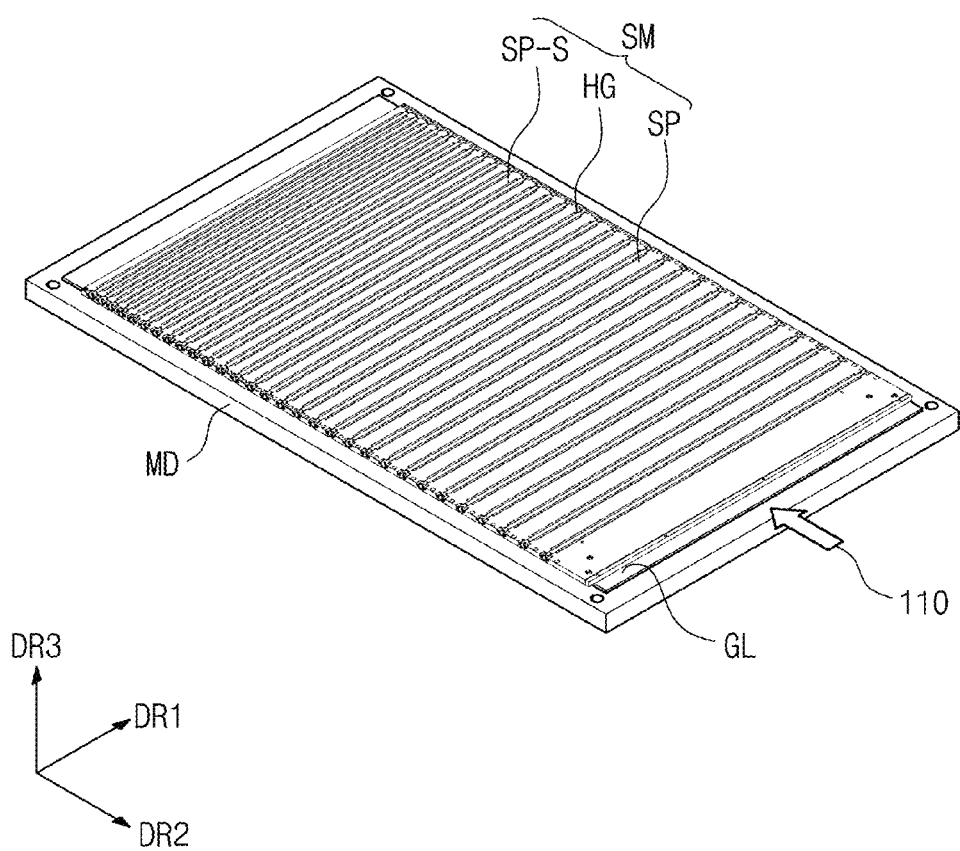

FIGS. 17A to 17C are perspective views showing the manufacturing method of the rollable display device according to an embodiment of the present disclosure. FIGS. 18A to 18D are cross-sectional views showing the manufacturing method of the rollable display device according to an embodiment of the present disclosure. The cross-sectional views show the cross-section viewed from the side view formed by the first direction DR1 and the third direction DR3.

FIG. 17A shows the disposing of a plate GL on a mold MD (S1). The mold MD may include a support part BS that supports the plate GL disposed on the mold MD. FIG. 17A shows the support part BS extending in the first direction DR1 and supporting some areas adjacent to an edge of the plate GL, however, the support part BS may entirely support a lower surface of the plate GL, and a shape of the support part BS should not be particularly limited as long as the support part BS may support the plate GL.

An upper surface of plate GL disposed on the mold MD may be flat. As the resin layer LR is formed on the flat upper surface of the plate GL, an upper surface of the resin layer LR may be flat. As an example, the plate GL may be a glass plate whose upper surface is flat. Since the resin layer LR is formed on the glass plate, the flatness of the upper surface of the resin layer LR may be improved. However, the plate GL should not be limited thereto or thereby.

FIG. 17B shows the disposing of the support module SM on the mold MD to define the separation space between the support module and the plate GL (S2). Detailed descriptions about the support module SM may be substantially the same as described above. The support module SM may be disposed to allow the upper surface of the support module SM to face the upper surface of the plate GL. In other words, the support module SM may be disposed such that the lower surface of the support module SM is viewed from the outside.

The manufacturing method of the rollable display device may further include disposing a protective film on the upper surface of the plate GL before the support module SM is provided on the plate GL. Accordingly, the plate GL with the protective film on the upper surface thereof may be disposed on the mold MD, and the resin layer LR may be formed on the protective film. The protective film may be a film forming the protective layer PF of the display module DM. After the plate GL is removed from the protective film, components of the display module DM may be disposed on the protective film. The protective film may protect some components of the display module DM, which are to be disposed on the protective film during a manufacturing process of the rollable display device. In addition, the protective film may allow the support module SM on which the resin layer LR (refer to FIG. 18C) is formed to be easily separated from the plate GL, however, it should not be limited thereto or thereby. The disposing of the protective film may be omitted.

FIG. 17C shows the filling of the resin in the separation space between the plate GL and the support module SM (S3). The resin may be filled in the separation space along a direction 110 to which the separation space is exposed. Referring to FIG. 17C, the separation space between the plate GL and the support module SM may be exposed to the second direction DR2 when viewed in the side view formed by the first direction DR1 and the third direction DR3, and the resin may be filled in the separation space along the second direction DR2.

The mold MD may further include outer walls surrounding the support module SM disposed thereon. The outer walls may prevent the resin from leaking to the outside of the support module SM and the mold MD during the filling of the resin.

FIG. 18A shows the disposing of the support module SM on the mold MD to define the separation space SS between the support module SM and the plate GL (S2). The support module SM may be disposed to allow the upper surface SM-U of the support module SM to face the upper surface of the plate GL. The separation space SS may be provide between the upper surface SM-U of the support module SM and the upper surface of the plate GL. The upper surface SM-U of the support module SM may correspond to the upper surface of the first portions SP-1 (refer to FIG. 6) of the first support bars SP-a.

The support module SM may have a shape including a portion bent from the upper surface SM-U of the support module SM. The bent portion of the support module SM may correspond to the second portion SP-2 (refer to FIG. 6) and the third portion SP-3 (refer to FIG. 6) of the first support bars SP-a. The upper surfaces SP-2-U and SP-3-U (refer to FIG. 6) of the second and third portions SP-2 and SP-3 (refer to FIG. 6) may be supported by the mold MD.

The separation space SS formed between the support module SM and the plate GL may be filled with the resin. The separation space SS may have a first thickness D1 in the third direction DR3. The first thickness D1 may correspond to the thickness of the resin layer LR formed by the following processes.

The manufacturing method of the rollable display device may further include coating a primer on the upper surface SM-U of the support module SM before the support module SM is provided on the plate GL. The primer may include a material that increases an adhesion between the support module SM and the resin. The adhesion between the upper surface SM-U of the support module SM and the resin filled in the separation space SS may increase by the primer. The resin provided in an area where the primer is not coated may be easily removed compared with the resin provided in an area where the primer is coated, and an area to which the resin is attached and an area to which the resin is not attached may be distinguished by the primer.

FIG. 18B shows the forming of the resin layer LR. The resin layer LR may be formed by filling the resin in the separation space SS and curing the filled resin (S3 and S4).

The bonding portion LM (refer to FIG. 10B) of the support module SM may be substantially simultaneously formed with the resin layer LR. The resin may be filled in the separation space between the first support bars SP-a (refer to FIG. 10B) and in the separation space SS between the plate GL and the support module SM by adjusting an amount of the resin, and then, the resin layer LR and the bonding portion LM (refer to FIG. 10B) may be substantially simultaneously formed through the curing process, however, it should not be limited thereto or thereby. According to an embodiment of the present disclosure, after the support module SM is disposed to allow the upper surface SM-U thereof to be viewed from the outside, the bonding portion LM (refer to FIG. 10B) may be formed by coating and curing the resin on the upper surface SM-U of the support module SM, and then, the resin layer LR may be formed.

The upper surface of the resin layer LR may be formed to correspond to the upper surface of the plate GL. The flatness of the upper surface of the resin layer LR may be improved by the plate GL, and thus, the surface quality of the display module DM disposed on the resin layer LR may be increased. The thickness of the resin layer LR may correspond to the first thickness D1 of the separation space SS.

Figure 18C:
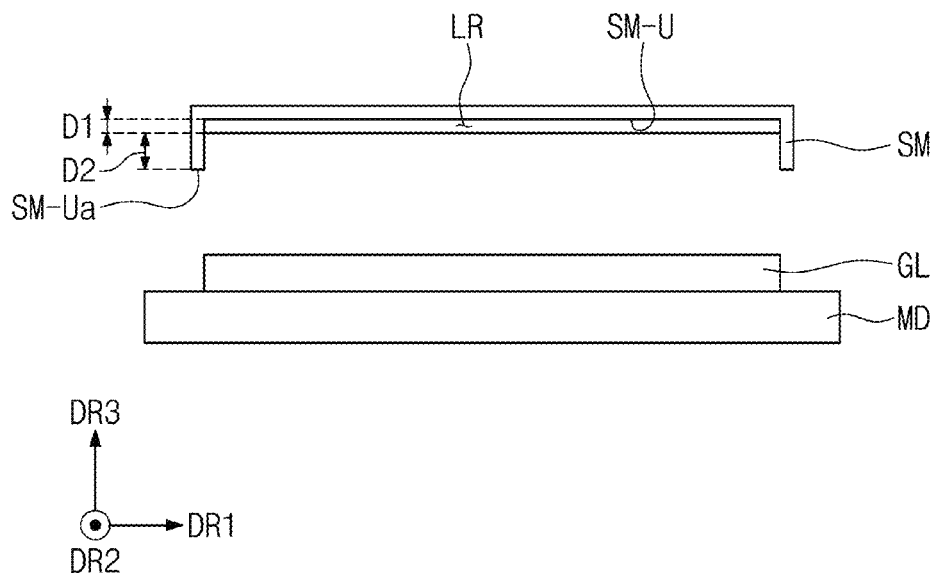

FIG. 18C shows the separating of the plate GL from the resin layer LR after the resin layer LR is formed on the support module SM (S5). As an example, the support module SM on which the resin layer LR is formed may be separated from the mold MD on which the plate GL is disposed.

An upper surface SM-Ua of the bent portion of the support module SM may correspond to the upper surfaces SP-2-U and SP-3-U (refer to FIG. 6) of the second and third portions SP-2 and SP-3 (refer to FIG. 6) of the first support bars SP-a. A length from the upper surface SM-Ua of the bent portion of the support module SM to the resin layer LR may be referred to as a second thickness D2.

Figure 18D:
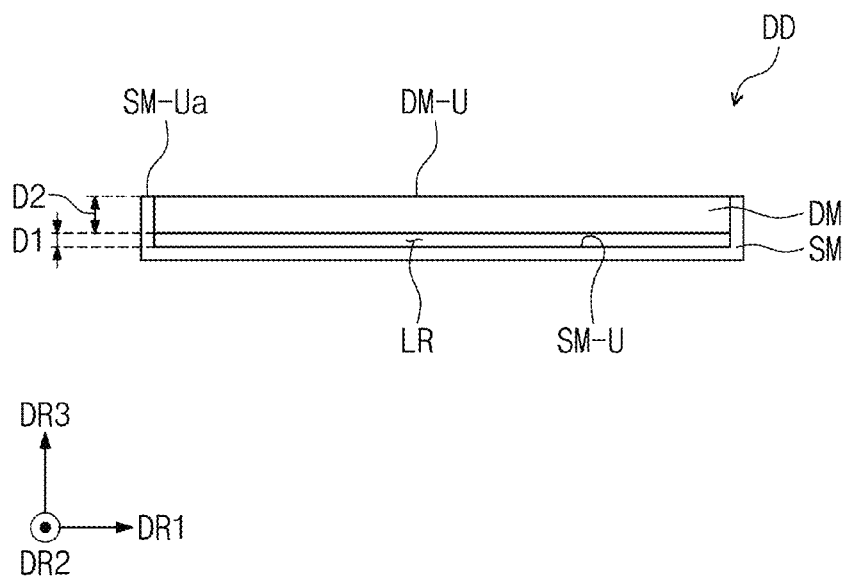

FIG. 18D shows the disposing of the display module DM on the resin layer LR separated from the plate GL (refer to FIG. 18C) to manufacture the rollable display device DD (S6). As an example, the display module DM may be attached to the resin layer LR through a lamination process.

The upper surface DM-U of the display module DM may be disposed at a position that is the same as a position at which the upper surface SM-Ua of the bent portion of the support module SM is disposed when viewed in cross-section. In other words, the thickness of the display module DM may be substantially the same as the second thickness D2, however, it should not be limited thereto or thereby. The surface quality of the display module DM may be increased by the resin layer LR formed on the upper surface SM-U of the support module SM that is uneven or has the gap.

Figure 19:
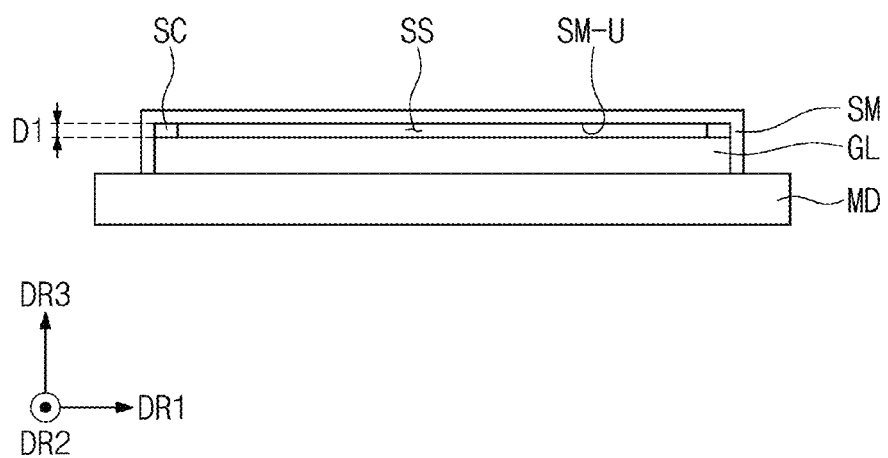
FIG. 19 is a cross-sectional view showing a method of manufacturing a rollable display device according to an embodiment of the present disclosure.

FIG. 19 shows the disposing of the support module SM on the mold MD to define the separation space SS between the support module SM and the plate GL among the manufacturing method of the rollable display device.

The manufacturing method of the rollable display device may further include disposing a spacer SC on the plate GL before the disposing of the support module SM. The spacer SC may be disposed on the upper surface of the plate GL to be adjacent to an edge of the plate GL. The spacer SC may support the upper surface SM-U of the support module SM.

The spacer SC may have a thickness corresponding to the thickness D1 of the separation space SS. The thickness of the resin layer LR may be adjusted by adjusting the thickness of the spacer SC.

The spacer SC may include the same material as the resin layer LR. The resin layer LR may be formed by curing the resin filled in the separation space SS in a state where the spacer SC is included in the resin.

Figure 20B:
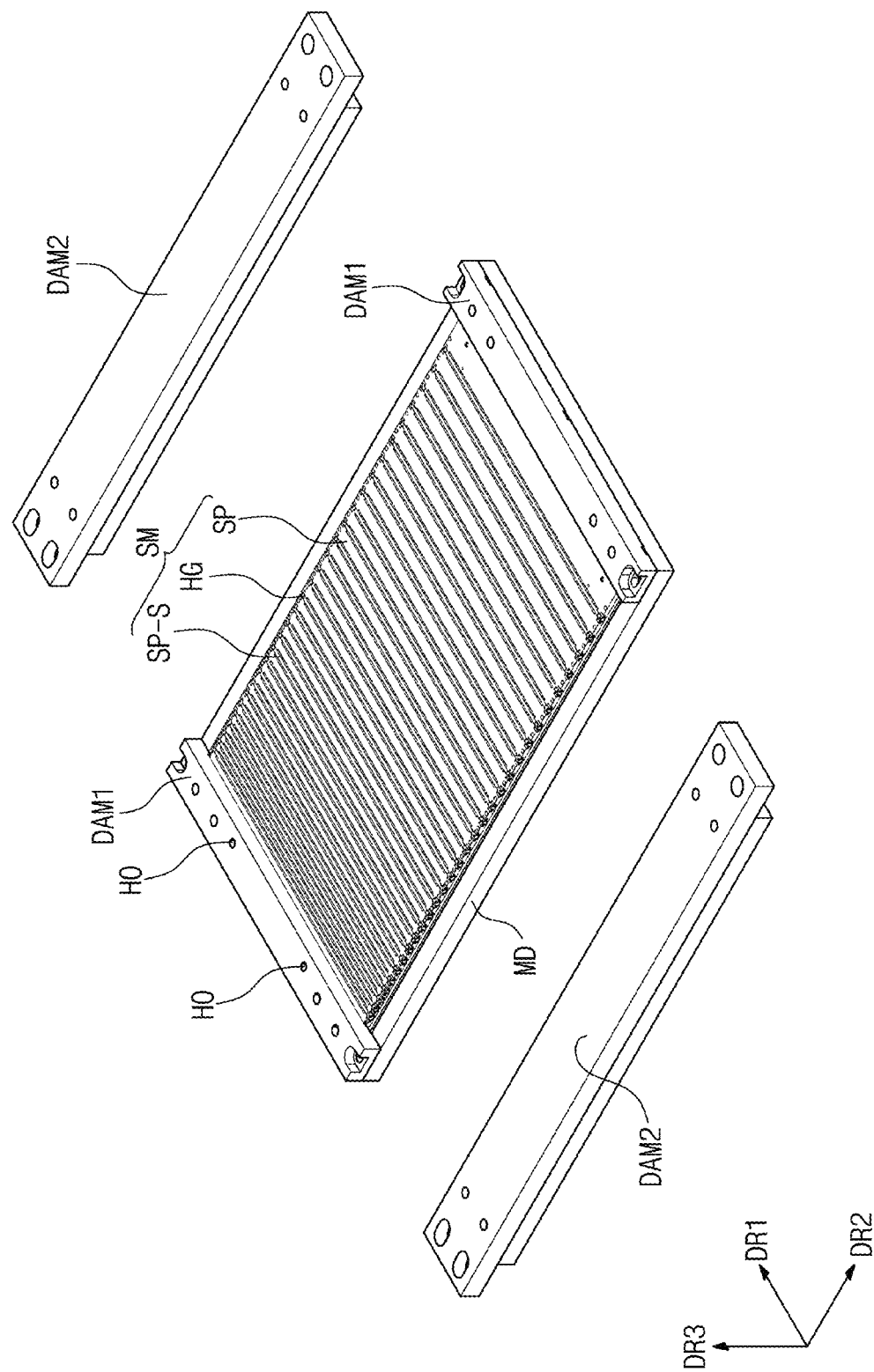
Figure 20C:
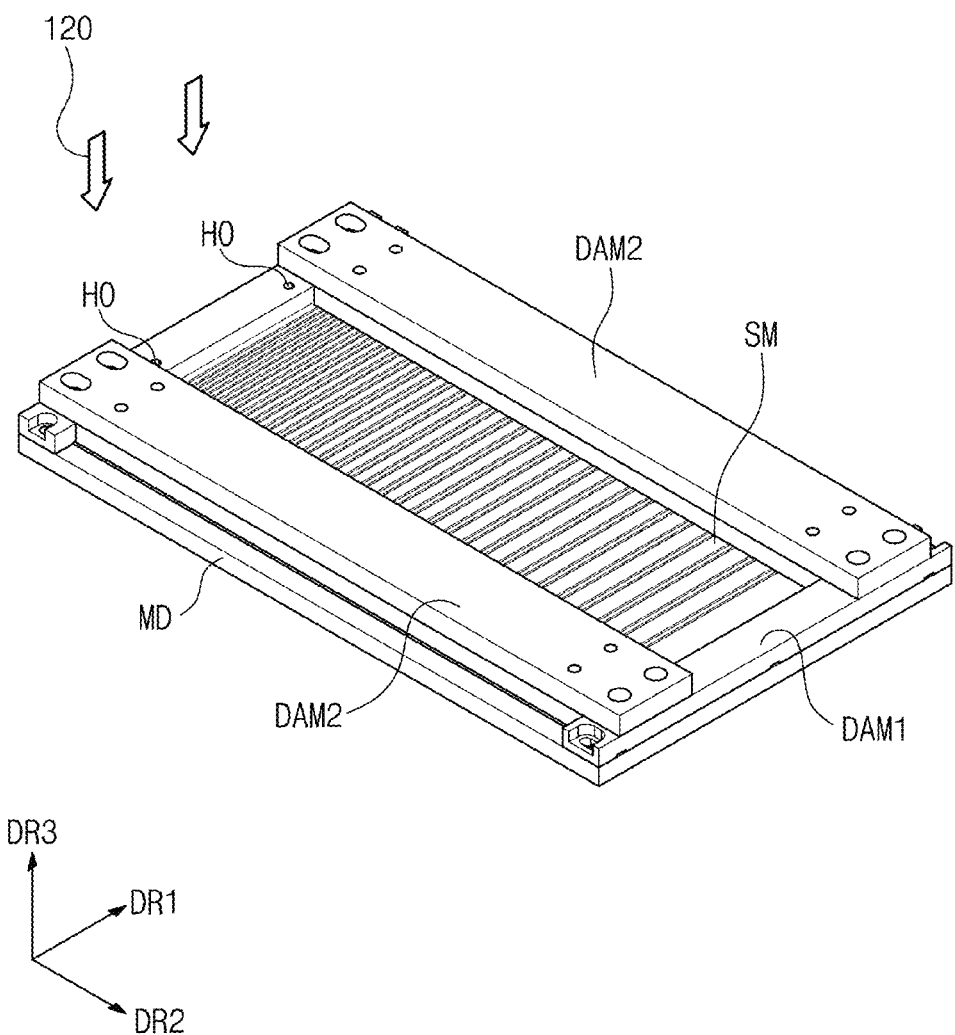
Figure 20D:
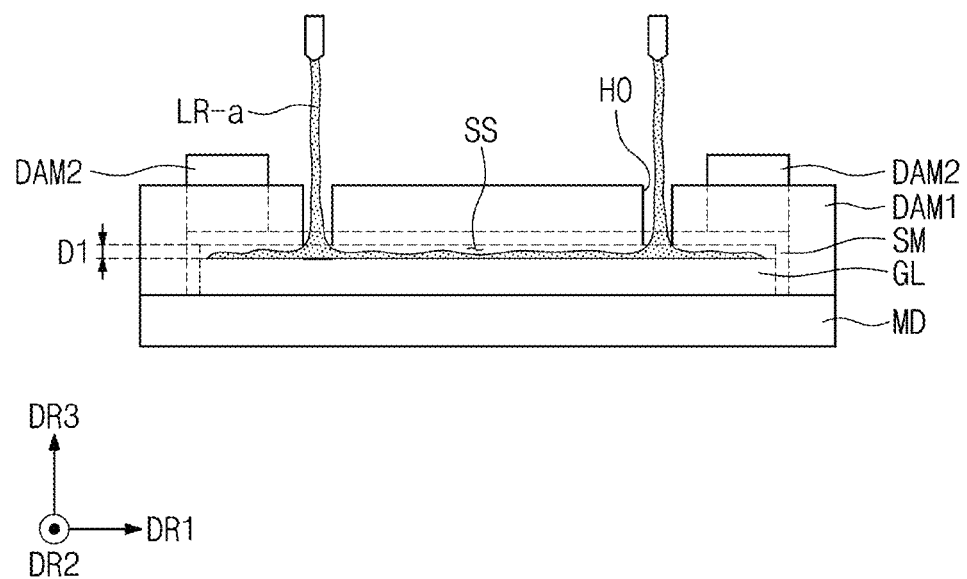
FIG. 20D is a cross-sectional view showing a method of manufacturing a rollable display device according to an embodiment of the present disclosure.

FIGS. 20A to 20C are perspective views showing the manufacturing method of the rollable display device according to an embodiment of the present disclosure. FIG. 20D is a cross-sectional view showing the manufacturing method of the rollable display device according to an embodiment of the present disclosure. The manufacturing method of the rollable display device may further include disposing a first dam portion DAM1 and a second dam portion DAM2 on the mold MD.

FIG. 20A is a perspective view showing the disposing of the first dam portion DAM1 on the mold MD on which the support module SM is disposed. The first dam portion DAM1 may be provided in plural, and the first dam portions DAM1 may be disposed on the mold MD.

The first dam portions DAM1 may extend in the first direction DR1 substantially parallel to the direction in which the support bars SP extend. The first dam portions DAM1 may support one end and the other end of the support module SM in the second direction DR2. The first dam portions DAM) may be spaced apart from each other with the support module SM interposed therebetween in the second direction DR2. In other words, the first dam portions DAM1 may be disposed at opposite sides of the support module SM in the second direction DR2.

The first dam portions DAM1 may be coupled with the mold MD, however, they should not be limited thereto or thereby. The first dam portions DAM1 may be disposed on and may be in contact with the mold MD and should not be particularly limited as long as the first dam portions DAM1 may support the support module SM.

The first dam portions DAM1 may prevent the resin filled in the separation space SS (refer to FIG. 20D) from leaking to the outside of the support module SM. In the manufacturing process of the rollable display device, the first dam portions DAM1 may allow the resin to be sufficiently filled in the separation space SS (refer to FIG. 20D) and may prevent the resin from being wasted.

At least one dam portion among the first dam portions DAM1 may be provided with a hole HO therethrough. The hole HO may pass through the first dam portion DAM1. The hole HO may be connected to the separation space SS (refer to FIG. 20D) between the plate GL and the support module SM. Accordingly, the resin may be injected through the hole HO, and the resin may be filled in the separation space SS (refer to FIG. 20D) after passing through the hole HO.

FIG. 20B is a perspective view showing the disposing of the second dam portion DAM2 on the mold MD on which the first dam portion DAM1 is disposed. The second dam portion DAM2 may be provided in plural, and the second dam portions DAM2 may be disposed on the mold MD.

The second dam portions DAM2 may extend in the second direction DR2 crossing the first direction DR1 in which the first dam portions DAM1 extend. The second dam portions DAM2 may support the lower surface of the support module SM, which is substantially parallel to the surface formed by the first direction DR1 and the second direction DR2. The second dam portions DAM2 may be spaced apart from each other in the first direction DR1. For example, the second dam portions DAM2 may be provided on opposite sides of the support module SM in the first direction DR1.

The second dam portions DAM2 may prevent the resin filled in the separation space SS (refer to FIG. 20D) from leaking to the outside of the support module SM. The second dam portions DAM2 may prevent the support module SM from shaking in the manufacturing process of the rollable display device.

The second dam portions DAM2 may be coupled with the first dam portions DAM1, however, they should not be limited thereto or thereby. According to an embodiment of the present disclosure, the second dam portions DAM2 may be disposed on the first dam portions DAM1 to make contact with the first dam portions DAM1 or may be directly coupled with the mold MD. However, the second dam portions DAM2 should not be particularly limited as long as the second dam portions DAM2 may support the support module SM.

FIG. 20C is a perspective view showing the filling of the resin in the separation space SS after the first dam portions DAM1 and the second dam portions DAM2 are disposed. FIG. 20D is a cross-sectional view showing the process of FIG. 20C. In FIG. 20D, for the convenience of explanation, the support module SM and the plate GL facing and overlapping one side surface of the first dam portion DAM1, which is substantially parallel to the first direction DR1 and the third direction DR3, are indicated by a dotted line.

The resin LR-a may be provided to the first dam portion DAM1 to be injected into the hole HO. A direction to which the resin LR-a is provided is indicated by a reference numeral of 120 in FIG. 20C. Referring to FIGS. 20c and 20D, the resin LR-a may be injected into the separation space SS provided between the plate GL and the support module SM, which is connected to the hole HO, after passing through the hole HO and may be filled in the separation space SS. When the resin is cured after being sufficiently filled in the separation space SS, the resin layer LR may be formed as shown in FIG. 18B.

According to the rollable display device of the present disclosure, the surface quality of the display module may be increased by the support module, the display module disposed on the support module, and the resin layer disposed between the support module and the display module. In addition, since the driving axis of the support module is provided to coincide with the neutral plane of the display module when viewed in cross-section, the degree to which the display panel included in the display module is compressed or tensioned by the external stress may be reduced, and the damage to the display panel may be prevented.

According to the manufacturing method of the rollable display device, since the resin layer that provides the flat upper surface is formed on the support module and the display module is disposed on the resin layer, the surface quality of the display module of the rollable display device may be increased. Since the manufacturing method of the rollable display device includes the disposing of the plate having the flat upper surface, the flatness of the resin layer formed between the support module and the plate may be improved. Since the manufacturing method of the rollable display device further includes the disposing of the dam portions, the support module may be fixed to prevent the support module from moving in the manufacturing process, and thus, the resin may be prevented from leaking to the outside of the support module.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein.

What is claimed is:
1. A rollable display device, comprising:
a support module;
a display module disposed on the support module and comprising a display area and a non-display area adjacent to the display area; and
a resin layer disposed between the support module and the display module, the display module comprising a display panel comprising a plurality of pixels, the support module comprising:
a plurality of support bars extending in a first direction and arranged in a second direction crossing the first direction, wherein the support bars are spaced. apart from each other; and
a plurality of hinges disposed between the support bars and coupled with the support bars disposed adjacent thereto, and
wherein each of the support bars is rotatably coupled with the hinges with respect to a driving axis extending in the first direction, and the driving axis penetrates the display panel when viewed in a cross-section, wherein each of the support bars has a width in the second direction and the widths of the support bars are different from each other, and wherein a difference in width between the support bars adjacent to each other is constant.

2. The rollable display device of claim 1, wherein a neutral plane of the display module is defined in the display panel at a same position as the driving axis when viewed in the cross-section.

3. The rollable display device of claim I, wherein the resin layer has a modulus equal to or greater than about 11 kPa and equal to or less than about 50 MPa.

4. The rollable display device of claim 1, wherein each of the support bars comprises a coupling portion, the coupling portion is inserted into a coupling recess in each of the hinges, and the coupling portion of each of the support bars move within the coupling recess.

5. The rollable display device of claim 1, wherein the support module further comprises a sub-support bar extending in the first direction and disposed between a pair of the support bars, and the sub-support bar is coupled with the hinges connected to the pair of the support bars.

6. The rollable display device of claim 1, wherein the support module further comprises a plurality of bonding portions filled in a separation space between the support bars.

7. The rollable display device of claim 6, wherein the bonding portions are provided integrally with the resin layer.

8. The rollable display device of claim 6, wherein the support bars comprise surfaces that are in contact with the bonding portions, and at least a portion of the surfaces comprises a curved surface.

9. The rollable display device of claim 1, wherein the support module further comprises a plurality of magnets inserted into at least one of the support bars.

10. The rollable display device of claim 9, wherein the magnets are spaced apart from the display area in a plane view.

11. The rollable display device of claim 1, wherein the display module further comprises:
a window disposed on the display panel; and
a protective layer disposed between the display panel and the resin layer, wherein a neutral plane is defined between a lower surface of the display panel and an upper surface of the display panel.

12. The rollable display device of claim 1, further comprising:
a flexible circuit board electrically connected to the display panel; and
a main circuit board disposed on a lower surface of the support module, the support bars comprising:
first support bars overlapping the display area and connected to each other; and
a second support bar connected to one first support bar disposed at an outermost position in the second direction among the first support bars, and
wherein the main circuit board is spaced apart from the first support bars in a plane view and overlaps the second support bar, and the flexible circuit board surrounds at least a portion of the second support bar and is electrically connected to the main circuit board.

13. The rollable display device of claim 12, wherein widths of the first support bars, which are defined in the second direction, increase as a distance from the second support bar decreases.

14. The rollable display device of claim 12, further comprising a case spaced apart from the display area and accommodating the flexible circuit board and the main circuit hoard.

15. A rollable display device, comprising:
a support module comprising a plurality of support bars and a plurality of hinges;
a display module disposed on the support module; and
a resin layer disposed between the display module and the support module,
wherein the plurality of support bars extended in a first direction and arranged in a second direction crossing the first direction, and the plurality of hinges connecting adjacent support bars to each other,
wherein widths of the support bars are different from each other, and
wherein a difference in width between the support bars adjacent to each other is constant.

16. The rollable display device of claim 15, wherein the widths of the support bars increase from a first side of the display module to a second side of the display module.

17. The rollable display device of claim 15, wherein the support module further comprises a plurality of sub-support bars connected to the hinges.

18. The rollable display device of claim 15, wherein the resin layer overlaps a gap between adjacent support bars.

19. A rollable display device, comprising:
a support module;
a display module disposed on the support module and comprising a display area and a non-display area adjacent to the display area; and
a resin layer disposed between the support module and the display module, the display module comprising a display panel comprising a plurality of pixels, the support module comprising:
a plurality of support bars extending in a first direction and arranged in a second direction crossing the first direction, wherein the support bars are spaced apart from each other; and
a plurality of hinges disposed between the support bars and coupled with the support bars disposed adjacent thereto, and
wherein each of the support bars is rotatably coupled with the hinges with respect to a driving axis extending in the first direction, and the driving axis penetrates the display panel when viewed in a cross-section,
wherein the support module comprises a rolling area and a peripheral area adjacent to the rolling area, the support module is in a flat state or in a rolled state depending on whether the support module is rolled with respect to a rolling axis spaced apart from the driving axis, a length of the rolling area of the support module defined in the second direction in the flat state satisfies the following Equation 1 of $$L = x \cdot a + \frac{x \cdot b(x-1)}{2},$$

an outer diameter of the support module in the rolled state satisfies the following Equation 2 of $D=(\sqrt{2}+1)\cdot\{a+(5+x)b\}$, L denotes the length of the rolling area of the support module, D denotes the outer diameter of the support module, x denotes a number of the support bars, a denotes a smallest width among the widths of the support bars, and b denotes a difference in width between the support bars adjacent to each other.

* * * * *